(12) United States Patent
Miki

(10) Patent No.: US 12,021,178 B2
(45) Date of Patent: Jun. 25, 2024

(54) LIGHT-EMITTING DEVICE AND METHOD OF MANUFACTURING THE LIGHT-EMITTING DEVICE

(71) Applicant: NICHIA CORPORATION, Anan (JP)

(72) Inventor: Takahito Miki, Tokushima (JP)

(73) Assignee: NICHIA CORPORATION, Anan (JP)

( * ) Notice: Subject to any disclaimer, the term of this patent is extended or adjusted under 35 U.S.C. 154(b) by 399 days.

(21) Appl. No.: 17/535,565

(22) Filed: Nov. 24, 2021

(65) Prior Publication Data
US 2022/0165929 A1 May 26, 2022

(30) Foreign Application Priority Data
Nov. 26, 2020 (JP) .................. 2020-196222

(51) Int. Cl.
*H01L 33/62* (2010.01)
*H01L 27/15* (2006.01)
*H01L 33/00* (2010.01)
*H01L 33/50* (2010.01)

(52) U.S. Cl.
CPC ............ *H01L 33/62* (2013.01); *H01L 27/156* (2013.01); *H01L 33/005* (2013.01); *H01L 33/504* (2013.01); *H01L 2933/0041* (2013.01); *H01L 2933/0066* (2013.01)

(58) Field of Classification Search
None
See application file for complete search history.

(56) References Cited

U.S. PATENT DOCUMENTS

| | | |
|---|---|---|
| 2002/0167015 A1 | 11/2002 | Okazaki |
| 2004/0135504 A1 | 7/2004 | Tamaki et al. |
| 2006/0038477 A1 | 2/2006 | Tamaki et al. |
| 2007/0018558 A1 | 1/2007 | Chua et al. |
| 2008/0089825 A1 | 4/2008 | Tamaki et al. |
| 2009/0008666 A1 | 1/2009 | Otsuka et al. |

(Continued)

FOREIGN PATENT DOCUMENTS

| | | |
|---|---|---|
| JP | 2001274462 A | 10/2001 |
| JP | 2002335015 A | 11/2002 |

(Continued)

*Primary Examiner* — Bilkis Jahan
(74) *Attorney, Agent, or Firm* — Global IP Counselors, LLP

(57) ABSTRACT

A light-emitting device includes a substrate, first and second light-emitting elements, a first frame, and first and second wavelength conversion members. The first light-emitting element is disposed on a first surface or first wirings of the substrate and electrically connected to the first wirings via first connecting members. The second light-emitting element is disposed on a surface of the first light-emitting element, and electrically connected to the second wirings via second connecting members. The first frame surrounds the first and second light-emitting elements in a top view. The first wavelength conversion member is disposed in a region surrounded by the first frame. The second wavelength conversion member is disposed in at least a part of the region surrounded by the first frame in the top view. A chromaticity of light converted by the first wavelength conversion member differs from a chromaticity of light converted by the second wavelength conversion member.

18 Claims, 13 Drawing Sheets

(56) References Cited

U.S. PATENT DOCUMENTS

| | | |
|---|---|---|
| 2009/0072708 A1 | 3/2009 | Tamaki et al. |
| 2009/0230840 A1 | 9/2009 | Tamaki et al. |
| 2009/0284132 A1 | 11/2009 | Tamaki et al. |
| 2009/0309485 A1 | 12/2009 | Tamaki et al. |
| 2010/0032691 A1* | 2/2010 | Kim .................. H01L 27/15 257/E33.067 |
| 2011/0198649 A1 | 8/2011 | Yamada |
| 2012/0130166 A1 | 5/2012 | Nishimura et al. |
| 2012/0248473 A1* | 10/2012 | Kuo .................. H01L 25/0756 257/E33.012 |
| 2014/0145225 A1* | 5/2014 | Wu .................. H01L 25/0756 257/98 |
| 2014/0191260 A1* | 7/2014 | Kuo .................. H01L 25/0756 257/89 |
| 2014/0203305 A1 | 7/2014 | Kawano et al. |
| 2018/0145232 A1 | 5/2018 | Hashimoto et al. |
| 2019/0371769 A1 | 12/2019 | Ghasemi Afshar et al. |

FOREIGN PATENT DOCUMENTS

| | | |
|---|---|---|
| JP | 2004-071726 A | 3/2004 |
| JP | 2005123560 | 5/2005 |
| JP | 2006173326 A | 6/2006 |
| JP | 2006352036 A | 12/2006 |
| JP | 2007036232 A | 2/2007 |
| JP | 2008300460 A | 12/2008 |
| JP | 2009004471 A | 1/2009 |
| JP | 2010041057 A | 2/2010 |
| JP | 2011171376 A | 9/2011 |
| JP | 2012114116 A | 6/2012 |
| JP | 2013098427 A | 5/2013 |
| JP | 2014107534 A | 6/2014 |
| JP | 2014138185 A | 7/2014 |
| JP | 2014229759 A | 12/2014 |
| JP | 2017045928 A | 3/2017 |
| JP | 2017054929 A | 3/2017 |
| JP | 2018085356 A | 5/2018 |

* cited by examiner

_US 12,021,178 B2_

LIGHT-EMITTING DEVICE AND METHOD OF MANUFACTURING THE LIGHT-EMITTING DEVICE

CROSS-REFERENCE TO RELATED APPLICATION

This application claims priority to Japanese Patent Applications No. 2020-196222, filed on Nov. 26, 2020, the disclosure of which is hereby incorporated by reference in its entirety.

BACKGROUND

The present disclosure relates to a light-emitting device and a method of manufacturing the light-emitting device.

A light-emitting device has been known in which light-emitting elements are mounted to be stacked over each other in the upper-lower direction, which allows a plurality of light-emitting elements to be incorporated into a single package to reduce a size of the package (for example, see Japanese Unexamined Patent Application Publication No. 2010-41057). There is a demand for such a light-emitting device to be adjustable in emission color.

SUMMARY

An object of certain embodiments of the present disclosure is to provide a small light-emitting device that allows for color adjustment, and a method of manufacturing the light-emitting device.

A light-emitting device according to one embodiment includes a substrate, a first light-emitting element, a second light-emitting element, a first frame, a first wavelength conversion member, and a second wavelength conversion member. The substrate has a first surface and a second surface on an opposite side to the first surface, and includes first wirings and second wirings on the first surface. The first light-emitting element is disposed on the first surface or the first wirings of the substrate and electrically connected to the first wirings via first connecting members. The first light-emitting element has a first surface and a second surface on an opposite side to the first surface. The second surface of the first light-emitting element faces the first surface of the substrate. The second light-emitting element is disposed on the first surface of the first light-emitting element, and electrically connected to the second wirings via second connecting members. The first frame is disposed on the first surface of the substrate to surround the first light-emitting element and the second light-emitting element in a top view. The first wavelength conversion member is disposed in a region surrounded by the first frame in the top view. A lower surface of the first wavelength conversion member is in contact with the first surface of the substrate. The second wavelength conversion member is disposed in at least a part of the region surrounded by the first frame in the top view. The second wavelength conversion member is in contact with an upper surface of the first wavelength conversion member, A chromaticity of light converted by the first wavelength conversion member differs from a chromaticity of light converted by the second wavelength conversion member.

A method of manufacturing a light-emitting device according to one embodiment includes: providing a substrate having a first surface and a second surface on an opposite side to the first surface, the substrate including first wiring and second wiring on the first surface; disposing a first light-emitting element on the first surface or the first wiring of the substrate, the first light-emitting element having a first surface and a second surface on an opposite side to the first surface, the second surface of the first light-emitting element facing the first surface of the substrate; electrically connecting the first light-emitting element to the first wiring via a first connecting member; disposing a second light-emitting element on the first surface of the first light-emitting element; forming a first frame on the first surface of the substrate to surround the first light-emitting element and the second light-emitting element in a top view; disposing a first wavelength conversion member in a region surrounded by the first frame in the top view so that a lower surface of the first wavelength conversion member is in contact with the first surface of the substrate; electrically connecting the second light-emitting element to the second wiring via a second connecting member; and disposing a second wavelength conversion member in at least a part of the region surrounded by the first frame in the top view so that the second wavelength conversion member is in contact with an upper surface of the first wavelength conversion member.

Certain embodiments of the present disclosure can provide a small light-emitting device that allows for color adjustment, and a method of manufacturing the light-emitting device.

DETAILED DESCRIPTION

Figure 1:
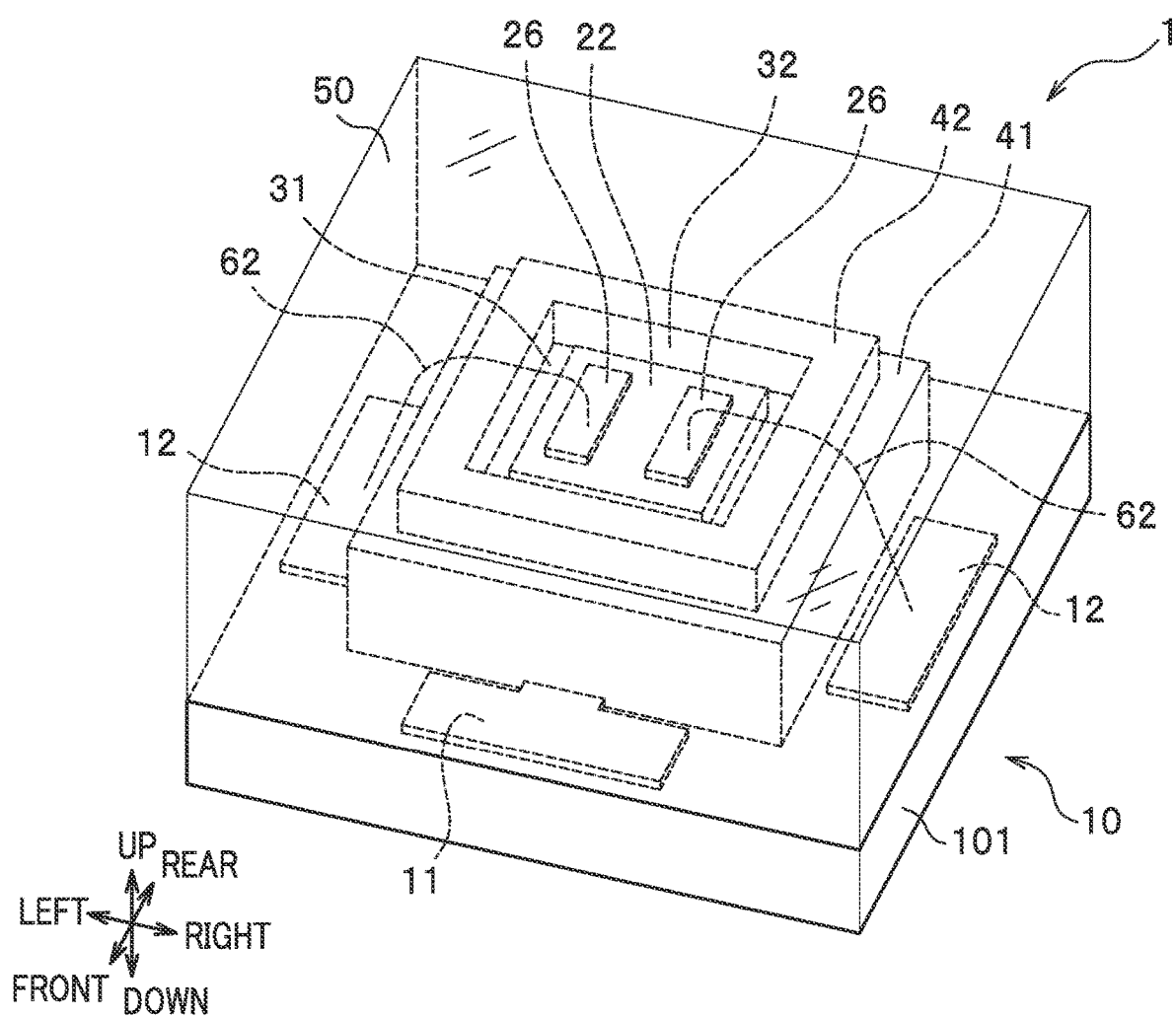
FIG. 1 is a schematic perspective view of a light-emitting device according to a first embodiment.

Certain embodiments according to the present disclosure will be described below referring to the accompanying drawings. The embodiments described below are intended to give a concrete form to the technical idea according to the present disclosure. The present invention is not limited to the embodiments below unless specifically stated otherwise. Description in one embodiment are applicable to other embodiments and modifications. The drawings schematically illustrate certain embodiments, and the scales, the distances, the positional relationships, and the like of members may be exaggerated, or illustration of portions of members may be omitted to clarify the descriptions. A direction in each drawing is not intended to indicate an absolute direction but represents a relative direction between components. The same term or reference numeral generally represents the same member or a member made of the same material, and its detailed description will be omitted as appropriate.

First Embodiment

Figure 2A:
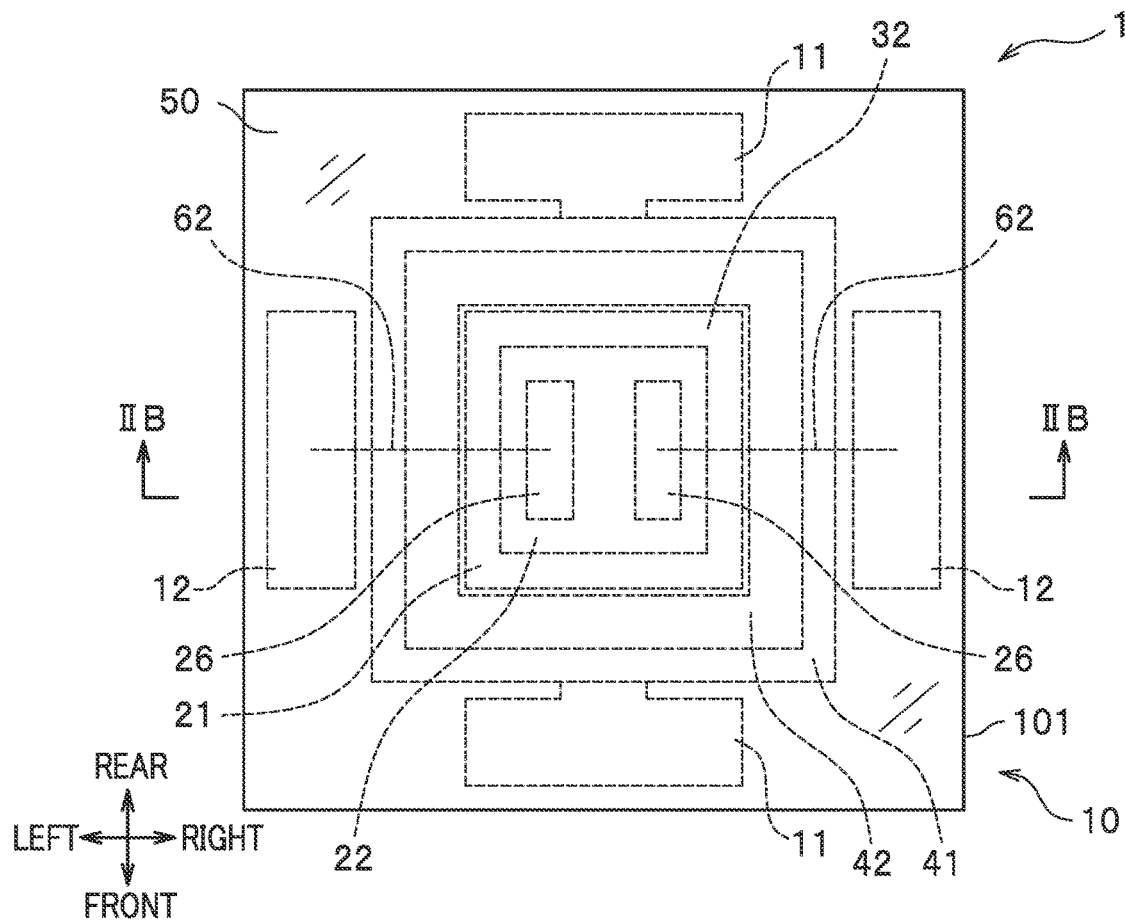
FIG. 2A is a schematic plan view of the light-emitting device according to the first embodiment.
Figure 2B:
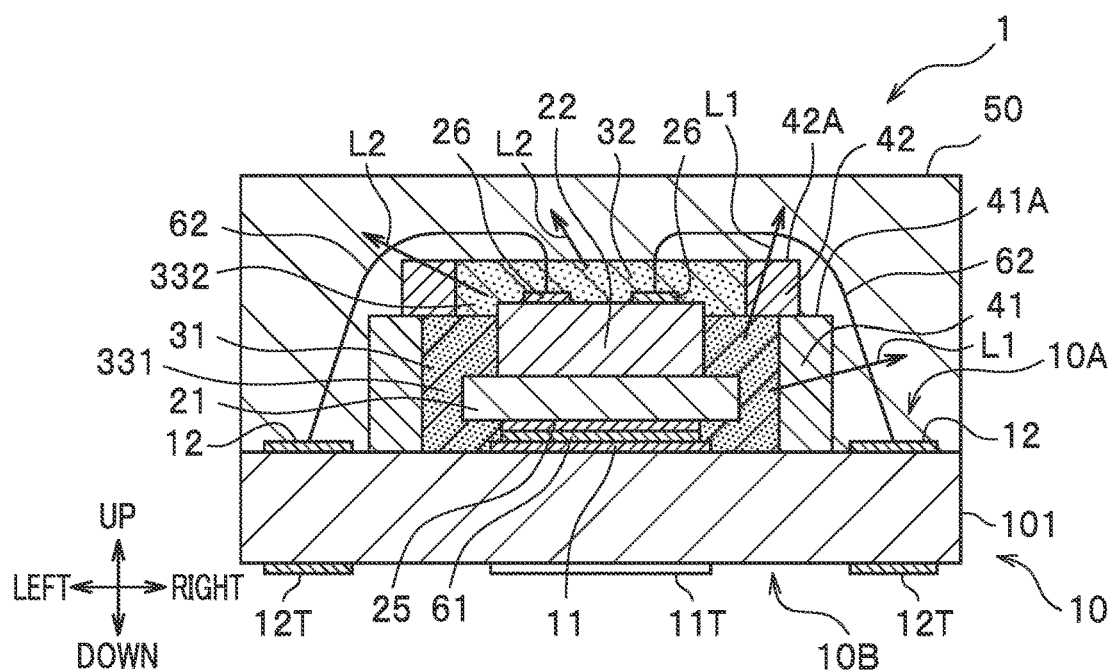
FIG. 2B is a schematic cross-sectional view taken along line IIB-IIB of FIG. 2A.
Figure 3:
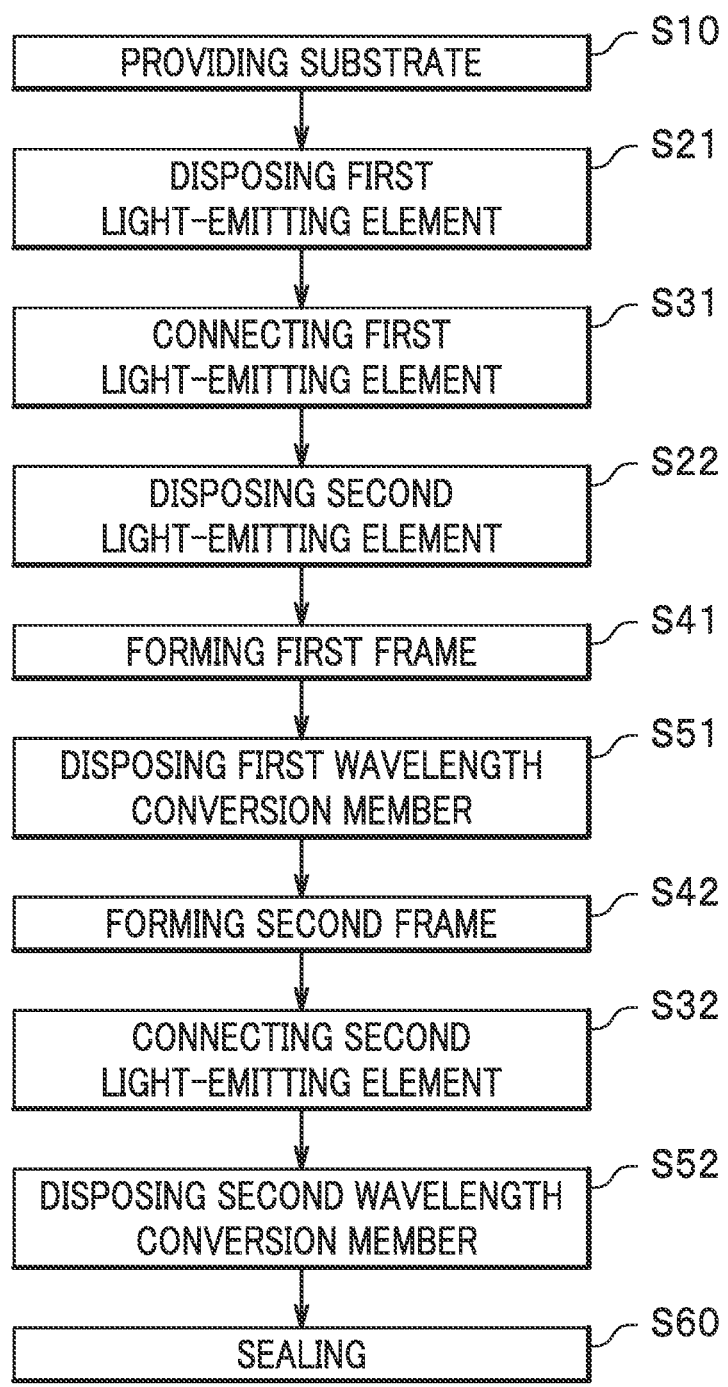
FIG. 3 is a flowchart illustrating a method of manufacturing the light-emitting device according to the first embodiment.

A light-emitting device 1 according to a first embodiment will be described referring to FIG. 1 to FIG. 2B.

The light-emitting device 1 includes a substrate 10, a first light-emitting element 21, a second light-emitting element 22, a first frame 41, a first wavelength conversion member 31, and a second wavelength conversion member 32. The substrate has a first surface 10A and a second surface 10B and includes a first wiring 11 and a second wiring 12 that are disposed on the first surface 10A. The first light-emitting element 21 is disposed on the first surface 10A or the first wiring 11 of the substrate 10 and is electrically connected to the first wiring 11 via a first connecting member 61. The second light-emitting element 22 is disposed on a surface (a first surface) of the first light-emitting element 21, the surface located at a side opposite to a side (a second surface) facing the substrate 10, and is electrically connected to the second wiring 12 via a second connecting member 62. The first frame 41 is disposed on the first surface 10A of the substrate 10 to surround the first light-emitting element 21 and the second light-emitting element 22. The first wavelength conversion member 31 is disposed in a region surrounded by the first frame 41 and is in contact with the first surface 10A of the substrate 10. The second wavelength conversion member 32 is disposed in the region surrounded by the first frame 41 and is in contact with a surface of the first wavelength conversion member 31, the surface located at a side opposite to a side having the substrate 10. A chromaticity of light converted by the first wavelength conversion member 31 differs from a chromaticity, of light converted by the second wavelength conversion member 32.

The light-emitting device 1 further includes a second frame 42 and a sealing member 50. The second frame 42 is disposed in contact with the upper surface of the first wavelength conversion member 31 to surround the second light-emitting element 22. The second wavelength conversion member 32 is disposed in a region surrounded by the second frame 42.

Structures of the light-emitting device 1 will be described below. The term "region surrounded by the first frame 41 or the second frame 42" refers to a region surrounded by inner walls of the first frame 41 or the second frame 42 in a top view.

Substrate

The first light-emitting element 21 is disposed on the substrate 10. The substrate 10 includes a base 101, the first wirings 11, the second wirings 12, first terminals 11T, second terminals 12T, and vias 15. The surface provided with the first wirings 11 and the second wirings 12 is the first surface 10A of the substrate 10. The surface opposite to the first surface 10A is the second surface 10B of the substrate 10.

For example, the base 101 is formed into a rectangular shape. For the material of the base 101A, resin such as epoxy, glass epoxy, bismaleimide triazine, and polyimide or an insulating member such as ceramic and glass can be used, and a material having physical properties such as a linear expansion coefficient close to the linear expansion coefficient of the first light-emitting element 21 is particularly preferable to be used.

Each first wiring 11 is connected to a respective one of the first terminals 11T disposed on the second surface 10B through corresponding ones of the vias 15 that will be described below and serves as a portion of a power supply path to the first light-emitting element 21. Each second wiring 12 is connected to a respective one of the second terminals 12T disposed on the second surface 10B through corresponding ones of the vias 15 and serves as a portion of a power supply path to the second light-emitting element 22. The first wiring 11 and the first terminals 11T are electrically separated from the second wiring 12 and the second terminals 12T.

For materials of the first wirings 11, the second wirings 12, the first terminals 11T, and the second terminals 12T, a metal such as copper, iron, nickel, tungsten, chromium, aluminum, titanium, palladium, rhodium, silver, platinum, and gold, or an alloy of two or more of these metals can be used. A single layer or a multilayer of such a metal or alloy may be used for the first wirings 11, the second wirings 12, the first terminals 11T, and the second terminals 12T.

The vias 15 are formed by disposing electroconductive members inside respective through holes extending through the base 101. A material of the electroconductive members can be, for example, substantially the same as a metal material of the first wirings 11 and the second wirings 12, Each electroconductive member may occupy the entirety of a corresponding through hole or may be an electroconductive film disposed on a portion of the through hole, such as the surface of the through hole. In the case in which an electroconductive film is disposed on a surface defining each through hole, an insulating material such as an epoxy resin may be supplied into a region inside the electroconductive film in the through hole.

A light-reflective member may be disposed on the first surface 10A of the substrate 10 to increase the light reflectivity on the surface of the substrate 10. It is preferable that the light-reflective member is white and contains a white pigment such as titanium oxide and magnesium oxide in the base material. Examples of the base material of the light-reflective member include resins such as silicone resins, epoxy resins, phenolic resins, polycarbonate resins, and acrylic resins and modified resins of these resins. The light-reflective member may further contain a filler such as silicon oxide, aluminum oxide, zirconium oxide, and zinc oxide.

First Light-Emitting Element and Second Light-Emitting Element

The first light-emitting element 21 and the second light-emitting element 22 are semiconductor elements, such as LED chips, that are configured to emit light when voltage is applied. Each of the first light-emitting element 21 and the second light-emitting element 22 includes at least a semiconductor layered body and positive and negative element electrodes on the same surface side.

For example, the semiconductor layered body includes a supporting substrate such as a sapphire or gallium nitride substrate, an n-type semiconductor layer and a p-type semiconductor layer disposed on the supporting substrate, and a light-emitting layer between these layers. For the semiconductor layered body, a semiconductor layered body in which the supporting substrate has been removed may be used. The light-emitting layer may have a structure with a single active layer, such as a double heterostructure or a single quantum well (SQW) structure, or a structure with a group of active layers, such as a multiple quantum well (MQW) structure. The light-emitting layer is configured to emit visible light or ultraviolet light. The light-emitting layer is configured to emit blue to red light as the visible light. The semiconductor layered body including such a light-emitting layer can contain, for example, $In_xAl_yGa_{1-x-y}N$ ($0 \le x$, $0 \le y$, and $x+y \le 1$).

The semiconductor layered body can include at least one light-emitting layer adapted to emit light having the emission color described above. For example, the semiconductor layered body may include one or more light-emitting layers between the n-type semiconductor layer and the p-type semiconductor layer or may have a structure in which the n-type semiconductor layer, the light-emitting layer, and the p-type semiconductor layer layered in order are repeated. When the semiconductor layered body includes a plurality of light-emitting layers, the semiconductor layered body may include light-emitting layers with different emission colors or light-emitting layers with the same emission color. The expression "same emission color" as used herein includes emission colors that can be regarded as the same at the time use, and allows for, for example, variations of approximately several nanometers in dominant wavelength. The combination of the emission colors can be appropriately selected, and examples of the combination include blue and blue, green and green, red and red, ultraviolet and ultraviolet, blue and green, blue and red, and green and red.

The first light-emitting element 21 is disposed on the first surface 10A or the first wirings 11 of the substrate 10. Element electrodes 25 of the first light-emitting element 21 are electrically connected to the first wirings 11. The first light emitting element 21 includes the element electrodes 25 on the same surface side and is face-down (flip-chip) mounted with a surface at a side provided with the element electrodes 25 facing the first surface 10A of the substrate 10. Each element electrode 25 and a corresponding first wiring 11 are bonded and electrically connected together using the first connecting members 61. The light extraction surface of the first light-emitting element 21 is a surface opposite to the surface provided with the element electrodes 25.

The second light-emitting element 22 is disposed on the light extraction surface of the first light-emitting element 21. Each of element electrodes 26 of the second light-emitting element 22 is electrically connected to a corresponding one of the second wirings 12 using a bonding wire that is the second connecting member 62. The second light-emitting element 22 includes the element electrodes 26 on the same surface side and is face-up mounted with the surface opposite to the surface at the side provided with the element electrodes 26 facing the light extraction surface of the first light-emitting element 21. The first light-emitting element 21 and the second light-emitting element 22 are bonded together with an insulating adhesive member. The insulating adhesive member is preferably light-transmissive and colorless, and, for example, an epoxy resin, a silicone resin, a phenolic resin, or a polyimide resin can be used. The light extraction surface of the second light-emitting element 22 is the surface provided with the element electrodes 26.

The first light-emitting element 21 and the second light-emitting element 22 are disposed such that the light extraction surfaces face the upper surface side of the light-emitting device 1 and that the second light-emitting element 22 is located inward of the outer periphery of the first light-emitting element 21 in a top view. The area dimension of the light extraction surface of the first light-emitting element 21 is greater than the area dimension of the light extraction surface of the second light-emitting element 22. The emission color of the first light-emitting element 21 and the emission color of the second light-emitting element 22 may be the same or different from each other.

First Wavelength Conversion Member and Second Wavelength Conversion Member

Each of the first wavelength conversion member 31 and the second wavelength conversion member 32 is disposed in contact with corresponding one or more of the light-emitting elements and is adapted to convert the wavelengths of light emitted from the light-emitting elements to emit light with different wavelengths.

The first wavelength conversion member 31 is disposed in a region surrounded by the first frame 41 described below and is disposed in contact with the first surface 101 of the substrate 10. The first wavelength conversion member 31 is disposed in contact with time light extraction surface and lateral surfaces of the first light-emitting element 21. In the example herein, the first wavelength conversion member 31 is also in contact with lateral surfaces of the second light-emitting element 22, That is, the upper surface of the first wavelength conversion member 31 is located between the light extraction surface of the first light-emitting element 21 and the light extraction surface of the second light-emitting element 22 in the direction from the substrate 10 toward the first light-emitting element 21.

In the example herein, the second wavelength conversion member 32 is disposed in a region surrounded by the second frame 42 described below. The second wavelength conversion member 32 is disposed in contact with the upper surface of the first wavelength conversion member 31 and the light extraction surface and a lateral surface of the second light-emitting element 22. That is, the upper surface of the second wavelength conversion member 32 is located above the light extraction surface of the second light-emitting element 22 to cover the light extraction surface of the second light-emitting element 22.

The outer periphery of the second wavelength conversion member 32 is preferably located inside the outer periphery of the first wavelength conversion member 31 in a top view. That is, the outermost perimeter of the first wavelength conversion member 31 is preferably longer than the outermost perimeter of the second wavelength conversion member 32 in a top view. The length of the first wavelength conversion member 31 in the diameter direction is preferably greater than the length of the second wavelength conversion member 32 in the diameter direction. That is, at least a portion of the upper surface of the first wavelength conversion member 31 is preferably located outward of the outer periphery of the second wavelength conversion member 32. The term "outermost perimeter in a top view" refers to the length of the perimeter along the outer periphery in a top view. The term "length in the diameter direction" refers to the greatest length between two points on the outer periphery in a top view.

The length between the first surface 10A of the substrate 10 and the upper surface of the first wavelength conversion member 31 is preferably greater than the length between the upper surface of the first wavelength conversion member 31 and the upper surface of the second wavelength conversion member 32. That is, in the direction from the substrate 10 toward the first light-emitting element 21, the first wavelength conversion member 31 preferably has a thickness greater than the thickness of the second wavelength conversion member 32.

For the first wavelength conversion member 31 and the second wavelength conversion member 32, a light-transmissive base material with a wavelength conversion substance contained in the base material can be used. Examples of the base material include resins such as silicone resins, epoxy resins, phenolic resins, polycarbonate resins, and acrylic resins, ceramics, and glass. The base material may contain a filler such as silicon oxide, aluminum oxide, zirconium oxide, and zinc oxide. The first wavelength conversion member 31 and the second wavelength conversion member 32 may be constituted of a single layer of one of these materials that can be used for the base material or layers of two or more of such materials.

The wavelength conversion substance is adapted to absorb at least a portion of primary light emitted from the light-emitting elements and emits secondary light that differs in wavelengths from the primary light. For example, the primary light emitted from the light-emitting elements and the secondary light emitted from the wavelength conversion substances contained in the wavelength conversion members can be mixed to obtain white light.

Examples of the wavelength conversion substances include yttrium-aluminum-garnet (YAG) based phosphors (such as $Y_3(Al,Ga)_5O_{12}:Ce$), lutetium-aluminum-garnet (LAG) based phosphors (such as $Lu_3(Al,Ga)_5O_{12}:Ce$), terbium-aluminum-garnet based phosphors (such as $Tb_3(Al,Ga)_5O_{12}:Ce$), β-SiAlON phosphors (such as $(Si,Al)_3(O,N)_4:Eu$), α-SiAlON phosphors (such as $M_z(Si,Al)_{12}(O,N)_{16}$ (where $0<z\leq2$, M is Li, Mg, Ca, Y, or a lanthanoid element other than La and Ce)), nitride based phosphors such as CASN based phosphors (such as $CaAlSiN_3:Eu$) and SCASN based phosphors (such as $(Sr,Ca)AlSiN_3:Eu$), fluoride based phosphors such as KSF based phosphors (such as $K_2SiF_6:Mn$) and MGF based phosphors (such as $3.5MgO\cdot0.5MgF_2\cdot GeO_2:Mn$), CCA based phosphors (such as $(Ca,Sr)_{10}(PO_4)_6Cl_2:Eu$), SAE based phosphors (such as $Sr_4Al_{14}O_{25}:Eu$), and quantum-dot phosphors. One of these phosphors can be used singly, or two or more of the phosphors can be used in combination for the wavelength conversion substance. The wavelength conversion substance contained in the first wavelength conversion member 31 is referred to as a first wavelength conversion substance 331, and the wavelength conversion substance contained in the second wavelength conversion member 32 is referred to as a second wavelength conversion substance 332.

In the light-emitting device 1, the chromaticity of light converted by the first wavelength conversion member 31 differs from the chromaticity of light converted by the second wavelength conversion member 32, The chromaticity of light converted by the first wavelength conversion member 31 is preferably on a longer wavelength side than the chromaticity of light converted by the second wavelength conversion member 32. The chromaticity of light converted by the first wavelength conversion member 31 is the chromaticity of secondary light emitted from the wavelength conversion substance contained in the first wavelength conversion member 31. The chromaticity of light converted by the second wavelength conversion member 32 is the chromaticity of secondary light emitted from the wavelength conversion substance contained in the second wavelength conversion member 32. The peak emission wavelengths of the first wavelength conversion member 31 and the second wavelength conversion member 32 preferably differ from each other. The peak emission wavelength of the first wavelength conversion member 31 is preferably longer than the peak emission wavelength of the second wavelength conversion member 32.

First Frame and Second Frame

The first frame 41 and the second frame 42 serve as outer frames for disposing the wavelength conversion members. The first frame 41 is disposed to face the entire lateral surfaces of the first light-emitting element 21 and portions of the lateral surfaces of the second light-emitting element 22. The second frame 42 is disposed to face portions of the lateral surfaces of the second light-emitting element 22, the portions not facing the first frame 41.

The first frame 41 is disposed on the first surface 10A of the substrate 10 and apart from the first light-emitting element 21 to surround the first light-emitting element 21 in a top view. An upper surface 41A of the first frame 41 is located between the light extraction surface of the first light-emitting element 21 and the light extraction surface of the second light-emitting element 22 in the direction from the substrate 10 toward the first element 21.

The second frame 42 is disposed in contact with the upper surface of the first wavelength conversion member 31 and apart from the second light-emitting element 22 to surround the second light-emitting element 22. In the direction from the substrate 10 toward the first light-emitting element 21, an upper surface 42A of the second frame 42 is located above the light extraction surface of the second light-emitting element 22. When the upper surface 41A of the first frame 41 and/or the upper surface 42A of the second frame 42 is curved in a cross section, a point in the upper surface 41A and/or 42A that is farthest from the first surface 10A of the substrate 10 is defined as a location of the upper surface 41A and/or 42A.

The first frame 41 and the second frame 42 preferably have insulating and light-transmissive properties. The light transmittances of the first frame 41 and the second frame 42 are preferably 70% or greater with respect to light emitted from the light-emitting elements and the wavelength conversion members. Examples of the materials of the first frame 41 and the second frame 42 include silicone resins, silicone modified resins, epoxy resins, polycarbonate resins, acrylic resins, and hybrid resins containing one or more of these resins.

First Connecting Member and Second Connecting Member

The first connecting members 61 and the second connecting members 62 electrically connect the element electrodes 25 and 26 of the first and second light-emitting elements 21 and 22 to the first wirings 11 and the second wirings 12, respectively.

Each of the first connecting members 61 is disposed between a corresponding one of the element electrodes 25 of the first light-emitting element 21 and a corresponding one of the first wirings 11 to bond and electrically connect the corresponding element electrode 25 and the corresponding first wiring 11 together. Examples of a material of the first connecting members 61 include bumps of gold, silver, or copper, electroconductive paste constituted of a mixture of powder of a metal such as gold, silver, copper, platinum, and aluminum and a resin binder, tin-silver-copper (SAC) solder, and tin-bismuth (SnBi) solder.

Each of the second connecting members 62 is disposed between a corresponding one of the element electrodes 26 of the second light-emitting element 22 and a corresponding one of the second wirings 12 astride the first frame 41 and the second frame 42 to electrically connect the element electrodes 26 and the second wiring 12 together. In the example herein, the second connecting members 62 are bonding wires. The bonding wires are linear shaped metal members. Examples of a material of the bonding wires include gold, copper, silver, platinum, aluminum, and alloys of these metals. Among these materials, gold is preferable because gold is less apt to be broken by stress generated by the wavelength conversion member and the sealing member described below and has good thermal resistance and the like. In order to enhance the light extraction efficiency of the light-emitting device, at least a surface of the linear shaped metal member may be made of silver or a silver alloy. The diameter of the bonding wires is preferably in a range of 18 μm to 30 μm.

Sealing Member

The sealing member 50 covers and protects members disposed on the first surface 10A side of the substrate 10. In the example herein, the sealing member 50 covers and protects the first light-emitting element 21, the second light-emitting element 22, the first frame 41, the second frame 42, the first wavelength conversion member 31, the second wavelength conversion member 32, the first connecting members 61, and the second connecting members 62. In particular, the sealing member 50 is disposed to protect the bonding wires (second connecting members 62).

The sealing member 50 preferably has insulating and light-transmissive properties. The light transmittance of the sealing member 50 is preferably 70% or greater with respect to light emitted from the first light-emitting element 21, the second light-emitting element 22, the first wavelength conversion member 31, and the second wavelength conversion member 32. For example, the material of the sealing member 50 can be substantially the same as the resin materials for the first frame 41 and/or the second frame 42.

The light-emitting device 1 includes the first wirings 11 connected to the first light-emitting element 21 and the second wirings 12 connected to the second light-emitting element 22. The first wirings 11 and the second wirings 12 are electrically separated from each other, and currents to be supplied can be individually controlled. Accordingly, the brightness of the first light-emitting element 21 and the brightness of the second light-emitting element 22 in the light-emitting device 1 can be individually adjusted, and the first light-emitting element 21 and the second light-emitting element 2 can be individually turned on and off.

The light-emitting device 1 includes the first wavelength conversion member 31 and the second wavelength conversion member 32 as two separate layers in the direction from the substrate 10 toward the first light-emitting element 21. The first wavelength conversion member 31 is disposed at a position through which light emitted from the first light-emitting element 21 mainly passes, and the second wavelength conversion member 32 is disposed at a position through which light emitted from the second light-emitting element 22 mainly passes. Accordingly, the light-emitting device 1 can emit first light L1, which is a mixture of primary light emitted from the first light-emitting element 21 and secondary light emitted from the first wavelength conversion substance 331 contained in the first wavelength conversion member 31, and second light L2, which is a mixture of primary light emitted from the second light-emitting element 22 and secondary light emitted from the second wavelength conversion substance 332 contained in the second wavelength conversion member 32. The brightness of the first light L1 and the brightness of the second light L2 can be individually adjusted.

In the light-emitting device 1, a chromaticity of light converted by the first wavelength conversion member 31 differs from a chromaticity of light converted by the second wavelength conversion member 32, so that the first light L1 and the second light L2 with different chromaticities can be obtained even when the emission colors of the first light-emitting element 21 and the second light-emitting element 22 are the same. The light-emitting device 1 can emit light with colors in a wide range by individually adjusting the brightness of the first light L1 and the second light L2 with different chromaticities and mixing the light.

The first light L1 and the second light L2 can be white light when at least one of a YAG based phosphor, a LAG based phosphor, an SCASN based phosphor, a CASN based phosphor, or a KSF phosphor are used as the first wavelength conversion substance 331 and at least one of a YAG based phosphor, a LAG based phosphor, an SCASN based phosphor, and a KSF phosphor are used as the second wavelength conversion substance 332. For example, by using light-emitting elements configured to emit blue light as the first light-emitting element 21 and the second light-emitting element 22, two types of phosphors including a YAG phosphor and a SCASN phosphor as the first wavelength conversion substance 331, and a YAG phosphor as the second wavelength conversion substance 332, the first light L1 can be white light with a color temperature of about 2700K, and the second light L2 can be white light with a color temperature of about 6500K. The emission color of the first wavelength conversion member 31 is on the longer wavelength side compared with the emission color emitting from the second wavelength conversion member 32; therefore, the first light L1 is white light with a low color temperature, and the second light L2 is white light with a high color temperature, Emission color of the light-emitting device 1 can be adjusted in the color temperature range of about 2700K to 6500K by individually adjusting the brightness of the first light L1 and the brightness of the second light L2.

In the light-emitting device 1, the outer periphery of the second wavelength conversion member 32 is located inward of the outer periphery of the first wavelength conversion member 31 in a top view, and the length of the first wavelength conversion member 31 in the diameter direction is greater than the length of the second wavelength conversion member 32 in the diameter direction. In the direction from the substrate 10 toward the first light-emitting element 21, the first wavelength conversion member 31 has the thickness greater than the thickness of the second wavelength conversion member 32. The first wavelength conversion member 31 is disposed also in contact with lateral surfaces of the second light-emitting element 22. This allows for increasing irradiation of the first wavelength conversion substance 331 contained in the first wavelength conversion member 31 with light. Accordingly, when the first light L1 has a low color temperature and the second light L2 has a high color temperature, a range of color temperature that can be obtained resulting from the color adjustment can be stably secured.

In the light-emitting device 1, the first light-emitting element 21 and the second light-emitting element 22 are stacked over each other in the upper-lower direction. This allows for reducing the area of the light-emitting device 1 as a light source and the mounting area. The first light-emitting element 21 and the second light-emitting element 22 are insulated from each other. Accordingly, in the light-emitting device 1, the first wiring 11 and the second wiring 12 electrically separated from each other can be effectively used, and the brightness of the first light-emitting element 21 and the brightness of the second light-emitting element 22 can be individually adjusted.

In the light-emitting device the first light-emitting element 21 is face-down (flip-chip) mounted on the substrate 10, and the second light-emitting element 22 is face-up mounted on the first light-emitting element 21. The second light-emitting element 22 is connected using the bonding wires. The first wavelength conversion member 31 and the second wavelength conversion member 32 are stacked over each other as two separate layers in the upper-lower direction. Such an arrangement of members allows for miniaturizing the light-emitting device 1.

In the light-emitting device 1, the second light-emitting element 22 is face-up mounted on the face-down mounted first light-emitting element 21, and the wavelength conversion members with different emission colors are disposed as two layers, so that a small light-emitting device that allows for color adjustment can be obtained.

In the light-emitting device 1 according to the first embodiment, the second frame 42 can be disposed within the region surrounded by the first frame 41 in a top view. In this case, in the direction from the substrate 10 toward the first light-emitting element 21, the upper surface of the first wavelength conversion member 31 can be located between the light extraction surface of the first light-emitting element 21 and the light extraction surface of the second light-emitting element 22, and the upper surface 41A of the first frame 41 can be located above the upper surface of the first wavelength conversion member 31, The inner wall of the first frame 41 may be or may not be in contact with the outer wall of the second frame 42.

Manufacturing Method of First Embodiment

A method of manufacturing the light-emitting device 1 will be described with reference to FIGS. 3 to 11B.

The method includes a substrate providing step S10, a first light-emitting element disposing step S21, a second light-emitting element disposing step S22, a first connecting step S31, a second connecting step S32, a first frame forming step S41, a first disposing step S51, and a second disposing step S52. In the substrate providing step S10, the substrate 10 including the first wiring 11 and the second wiring 12 is provided. In the first light-emitting element disposing step S21, the first light-emitting element 21 is disposed on the substrate 10. In the second light-emitting element disposing step S22, the second light-emitting element 22 is disposed on the first light-emitting element 21. In the first connecting step S31, the first light-emitting element 21 is electrically connected to the first wiring 11 via the first connecting members 61. In the second connecting step S32, the second light-emitting element 22 is electrically connected to the second wiring 12 via the second connecting members 62. In the first frame forming step S41, the first frame 41 is formed on the first surface 10A of the substrate 10 to surround the first light-emitting element 21 and the second light-emitting element 22. In the first disposing step S51, the first wavelength conversion member 31 is disposed in the region surrounded by the first frame 41. In the second disposing step S52, the second wavelength conversion member 32 is disposed in the region surrounded by the first frame 41.

The method of manufacturing the light-emitting device 1 further includes a second frame forming step S42 and a sealing step S60. In the second frame forming step S42, the second frame 42 is formed on the upper surface of the first wavelength conversion member 31 to surround the second light-emitting element 22. In the sealing step S60, the sealing member 50 is formed. In the second disposing step S52, the second wavelength conversion member 32 is disposed in the region surrounded by the second frame 42, The second connecting step S32 is performed after the first disposing step S51, and the second disposing step S52 is performed after the second connecting step S32.

These steps in the method of manufacturing the light-emitting device 1 will be described below. The term "region surrounded by the first frame 41 or the second frame 42" refers to a region surrounded by the inner wall of the first frame 41 or the second frame 42 in a top view.

Substrate Providing Step

In the substrate providing step S10, the substrate 10 having the first surface 10A and the second surface 10B and including the first wiring 11 and the second wiring 12 on the first surface 10A is provided.

Figure 4A:
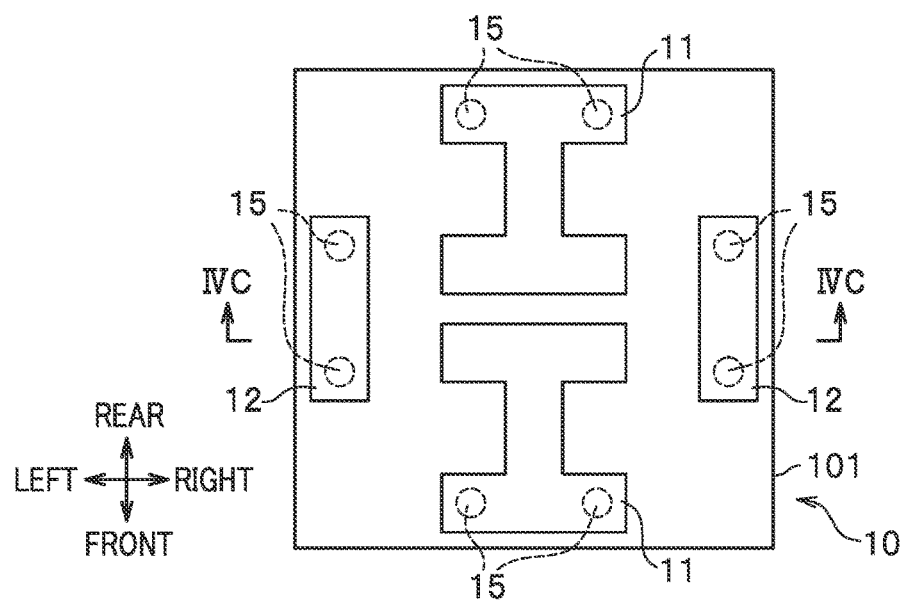
FIG. 4A is a schematic plan view of a substrate provided in the method of manufacturing the light-emitting device according to the first embodiment.
Figure 4B:
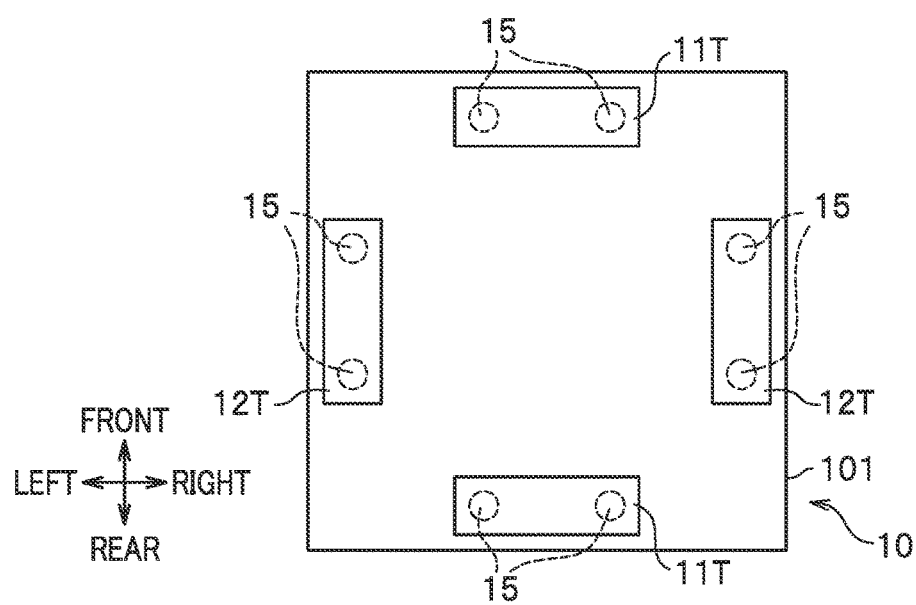
FIG. 4B is a schematic bottom view of the substrate provided in the method of manufacturing the light-emitting device according to the first embodiment.
Figure 4C:
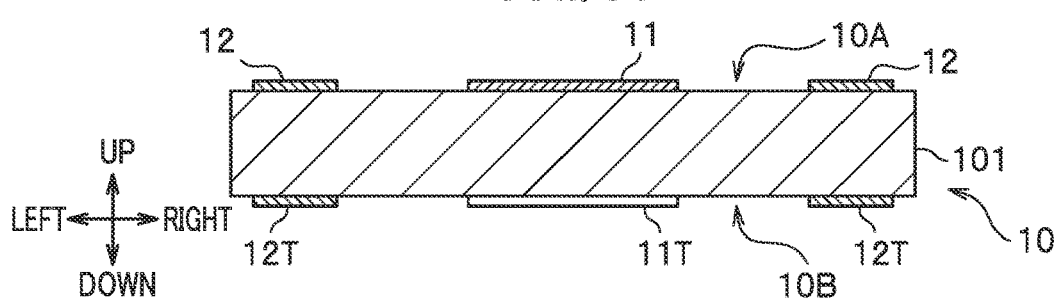
FIG. 4C is a schematic cross-sectional view taken along line IVC-IVC of FIG. 4A.

The first wiring 11 and the second wiring 12 are formed on one surface of the base 101 as shown in FIG. 4A by, for example, etching. On another surface of the base 101, the first terminals 11T are formed opposite to the first wiring 11, and the second terminals 12T are formed opposite to the second wiring 12. The surface on which the first wiring 11 and the second wiring 12 are formed is the first surface 10A of the substrate 10, and the surface on which the first terminals 11T and the second terminals 12T are formed is the second surface 10B. The vias 15 penetrating the base 101 are formed between the first wiring 11 and the first terminals 11T and between the second wiring 12 and the second terminals 12T as shown in FIGS. 4A and 48. The electroconductive members are disposed inside the vias 15 to connect each first wiring 11 to a respective first terminal 11T and to connect each second wiring 12 to a respective second terminal 12T. In the substrate providing step S10, the substrate 10 provided with the members described above can be provided by purchasing.

First Light-Emitting Element Disposing Step

Figure 5A:
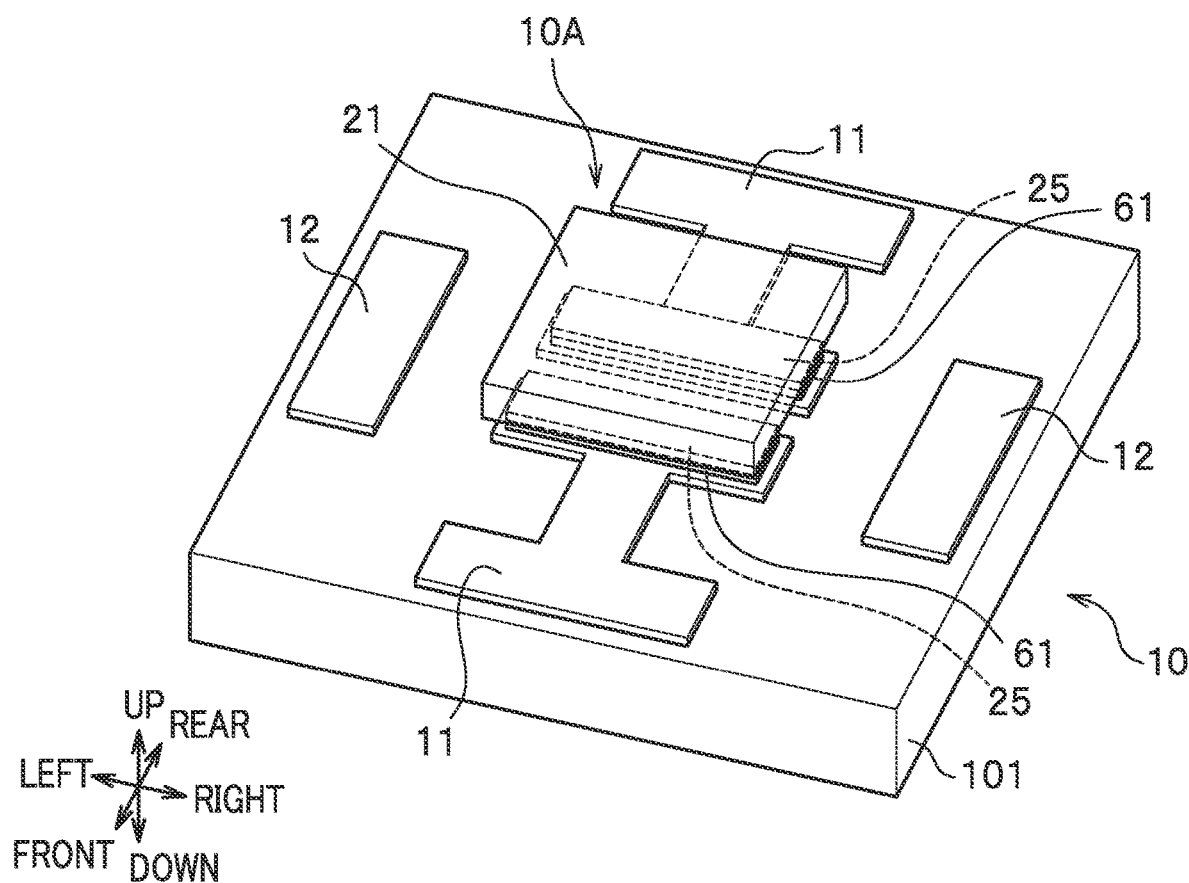
FIG. 5A is a schematic perspective view illustrating a state where a first light-emitting element is disposed on the substrate in the method of manufacturing the light-emitting device according to the first embodiment.

In the first light-emitting element disposing step S21, the first light-emitting element 21 is disposed on the first surface 10A or the first wiring 11 of the substrate 10. In the example herein, as shown in FIG. 5A, the first light-emitting element 21 is disposed such that the surface provided with the element electrodes 25 faces the first surface 10A of the substrate 10, and such that the element electrodes 25 faces the first connecting members 61 disposed on the first wirings 11.

First Connecting Step

In the first connecting step S31, the first light-emitting element 21 is electrically connected to the first wirings 11 via the first connecting members 61. In the example herein, each first connecting member 61 bond and electrically connect a respective element electrode 25 to a respective first wiring 11. In the first connecting step S31, for example, in the case in which the first connecting members 61 are formed of silver paste, the silver paste is hardened by heating to a predetermined temperature.

In the first light-emitting element disposing step S21 and the first connecting step S31, the first light-emitting element 21 is face-down (flip-chip) mounted on the first surface 10A of the substrate 10.

Second Light-Emitting Element Disposing Step

Figure 5B:
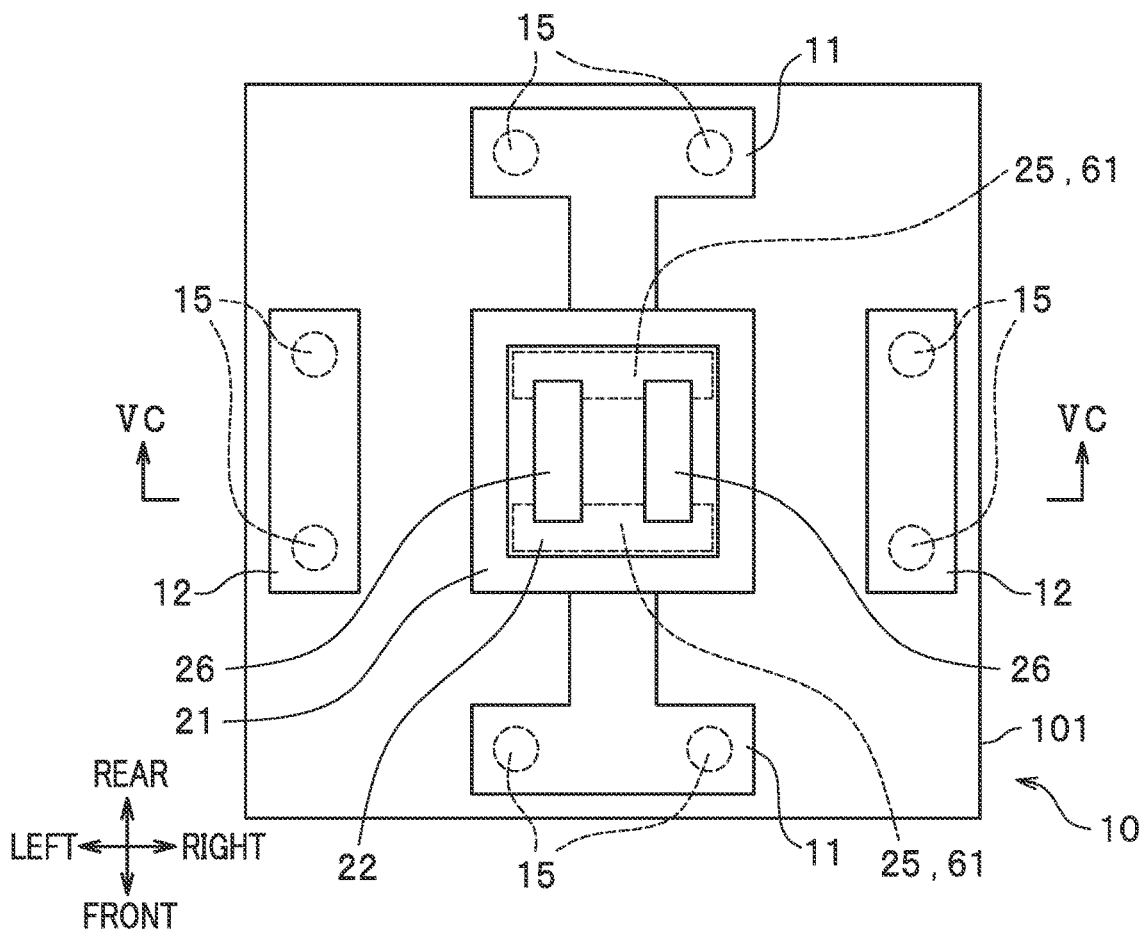
FIG. 5B is a schematic plan view illustrating a state where a second light-emitting element is disposed on the first light-emitting element in the method of manufacturing the light-emitting device according to the first embodiment.
Figure 5C:
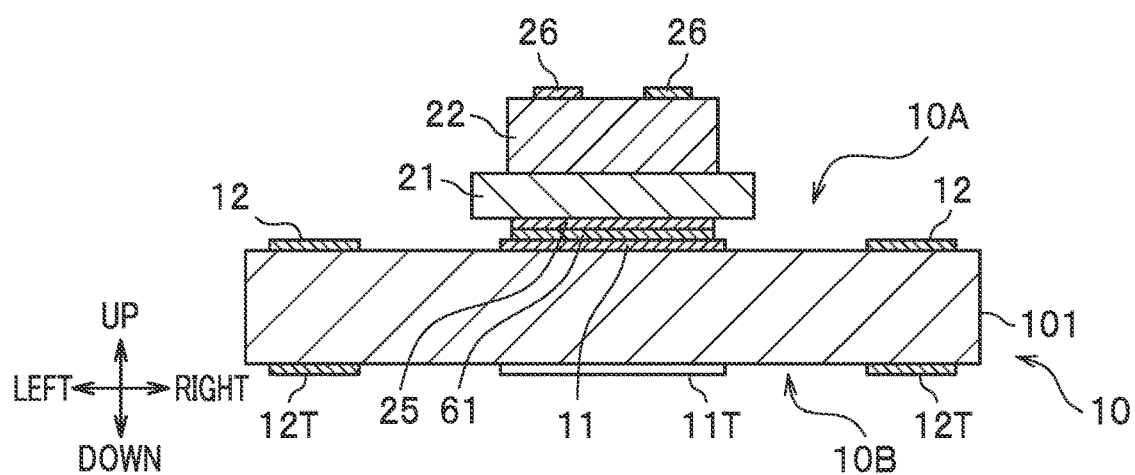
FIG. 5C is a schematic cross-sectional view taken along the line VC-VC of FIG. 5B.

In the second light-emitting element disposing step S22, the second light-emitting element 22 is disposed on the light extraction surface of the first light-emitting element 21, that is, the surface of the first light-emitting element 21 at a side opposite to a side having the substrate 10. In the example herein, as shown in FIGS. 5B and 5C, the second light-emitting element 22 is face-up mounted on the light extraction surface of the first light-emitting element 21 with the element electrodes 26 facing the upward direction of the light-emitting device 1. The first light-emitting element 21 and the second light-emitting element 22 are bonded together via an insulating, light-transmissive, colorless adhesive member.

First Frame Forming Step

Figure 6A:
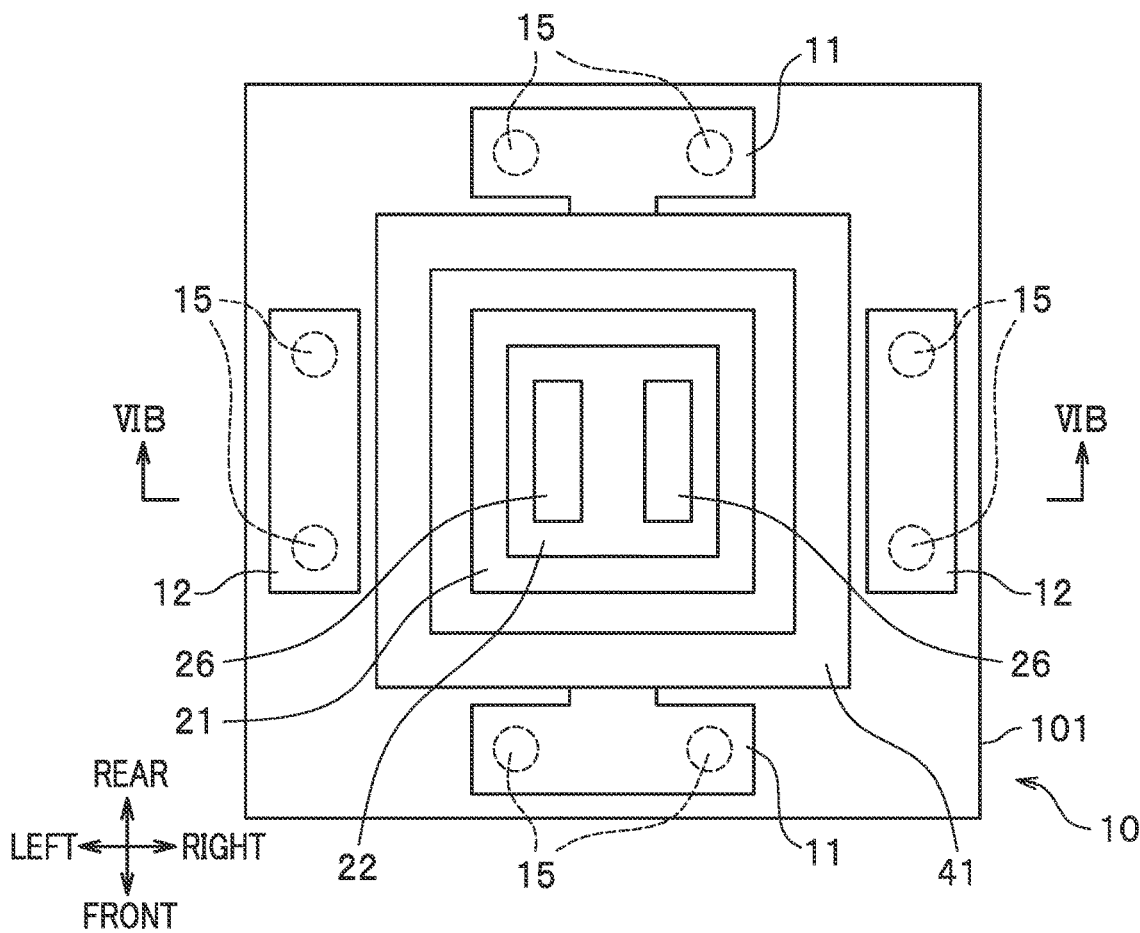
FIG. 6A is a schematic plan view illustrating a state where a first frame is formed in the method of manufacturing the light-emitting device according to the first embodiment.
Figure 6B:
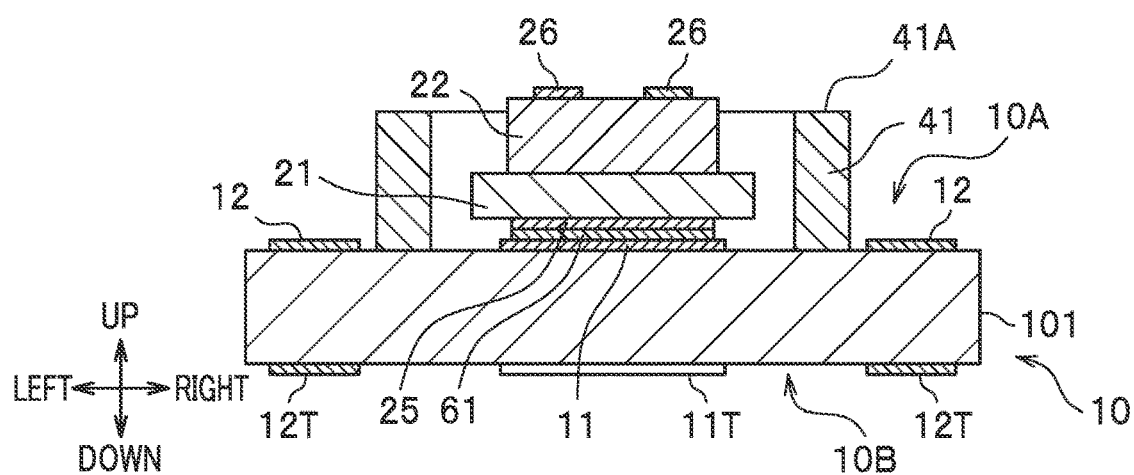
FIG. 6B is a schematic cross-sectional view taken along line VIB-VIB of FIG. 6A.
Figure 7A:
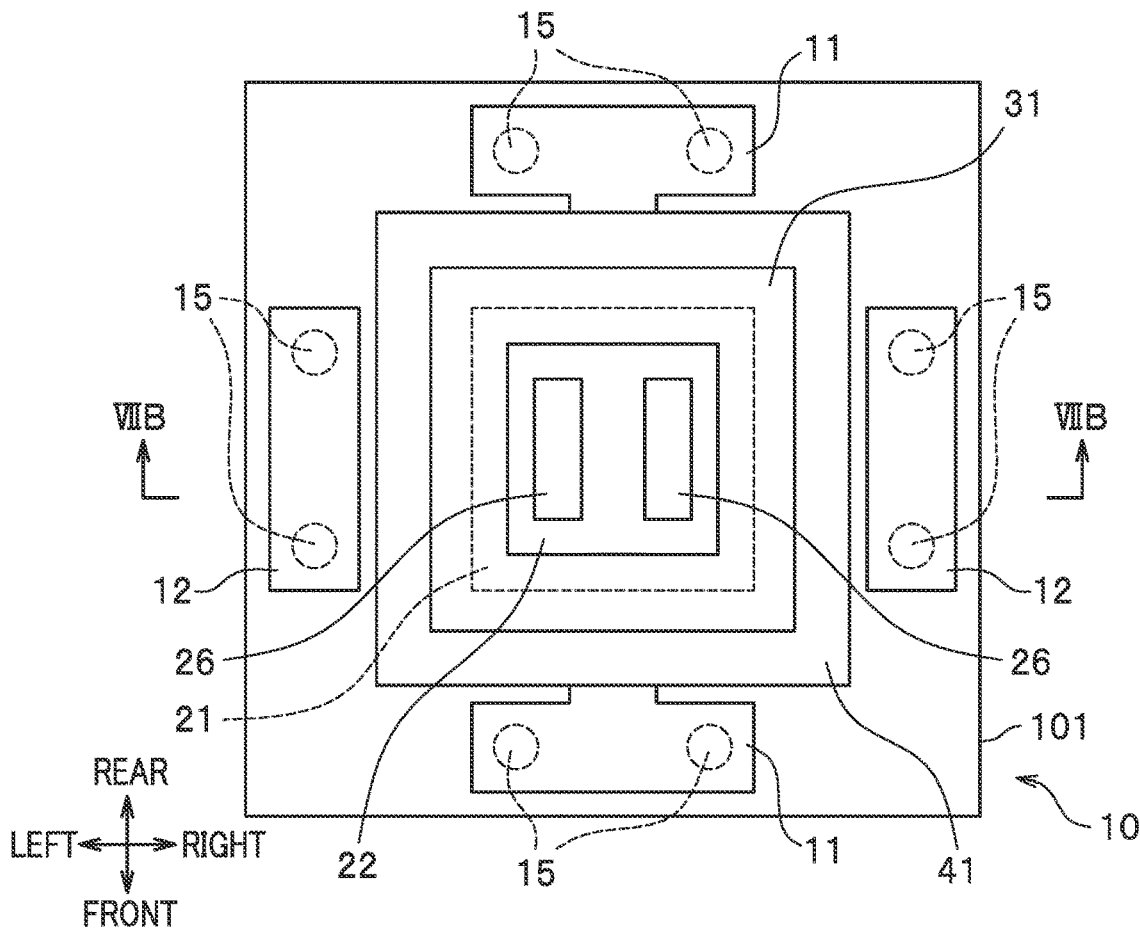
FIG. 7A is a schematic plan view illustrating a state where a first wavelength conversion member is disposed in the method of manufacturing the light-emitting device according to the first embodiment.
Figure 7B:
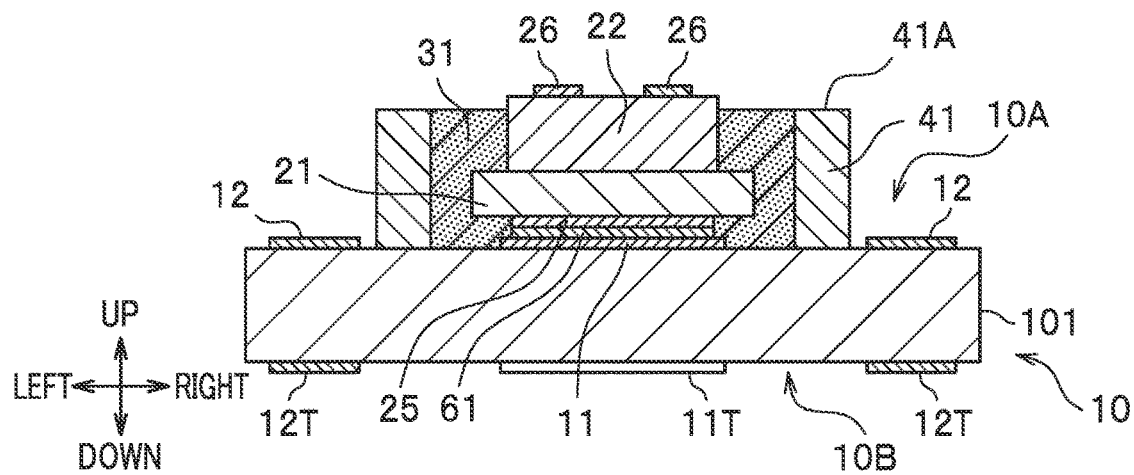
FIG. 7B is a schematic cross-sectional view taken along line VIIB-VIIB of FIG. 7A.

In the first frame forming step S41, the first frame 41 is formed on the first surface 10A of the substrate 10 to surround the first light-emitting element 21 and the second light-emitting element 22. In the example herein, as shown in FIGS. 6A and 68, the first frame 41 is formed to surround the first light-emitting element 21 and the second light-emitting element 22 at a certain distance away in a top view.

For example, the first frame 41 can be formed by applying and curing an uncured resin material. For example, the uncured resin material can be clayish and applied using a dispensing nozzle to surround the first light-emitting element 21 and the second light-emitting element 22. For example, the resin material is applied to the first surface 10A of the substrate 10 on the first turn and to the resin material that has already been applied on the second and subsequent turns. The height of the upper surface 41A of the first frame 41 from the first surface 10A can be adjusted by the number of turns of application. The applied uncured resin material is then cured. In the example herein, the upper surface 41A of the first frame 41 is located between the light extraction surface of the first light-emitting element 21 and the light extraction surface of the second light-emitting element 22.

The first frame 41 can also be formed using a known method such as printing, transfer molding, and compression molding. Before the first frame forming step S41, a step of forming a light-reflective member to cover a portion of the first surface 10A of the substrate 10 other than the first wiring 11 and the second wiring 12 may be performed.

First Disposing Step

In the first disposing step S51, the first wavelength conversion member 31 is disposed in the region surrounded by the first frame 41 to be in contact with the first surface 10A of the substrate 10. The first wavelength conversion member 31 is disposed such that the light extraction surface of the second light-emitting element 22 is exposed from the first wavelength conversion member 31. The upper surface of the first wavelength conversion member 31 is located between the light extraction surface of the first light-emitting element 21 and the light extraction surface of the second light-emitting element 22.

For example, the first wavelength conversion member 31 can be formed by injecting an uncured resin material mixed with a phosphor with the use of a potting technique and then curing the resin material. In the example herein, the uncured resin material is injected and cured such that the position of the upper surface of the first wavelength conversion member 31 coincides with the position of the upper surface 41A of the first frame 41.

Second Frame Forming Step

Figure 8A:
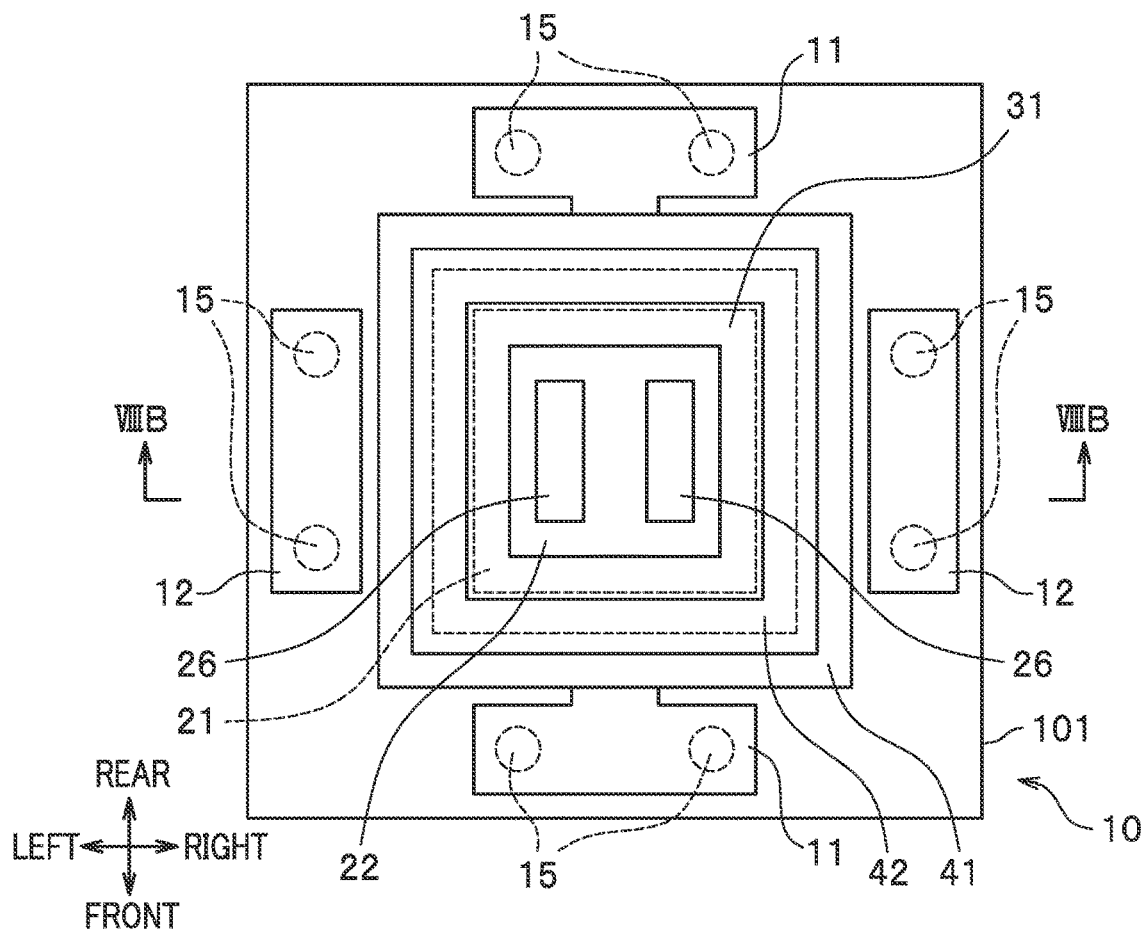
FIG. 8A is a schematic plan view illustrating a state where a second frame is formed in the method of manufacturing the light-emitting device according to the first embodiment.
Figure 8B:
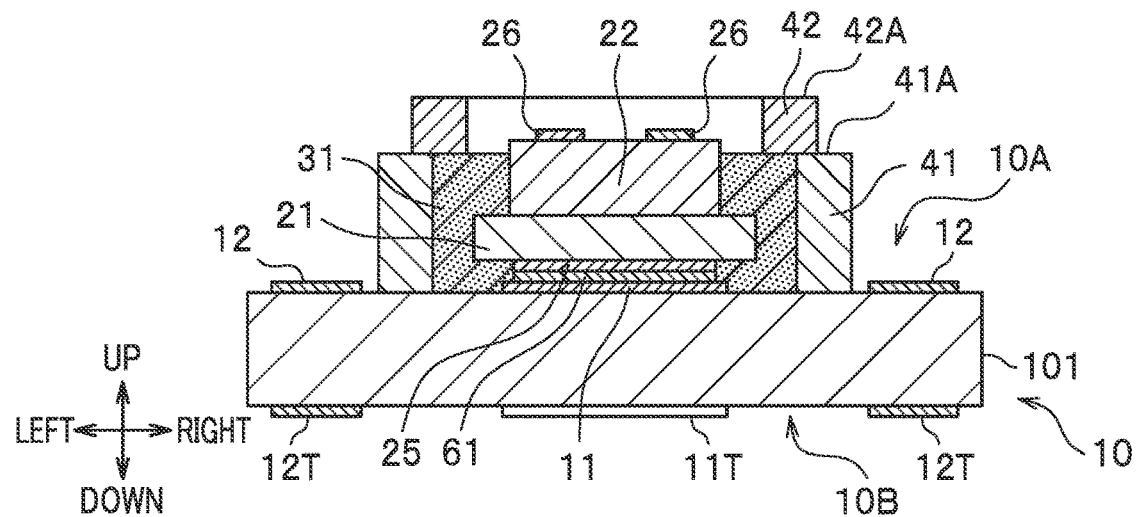
FIG. 8B is a schematic cross-sectional view taken along line VIIIB-VIIIB of FIG. 8A.
Figure 9A:
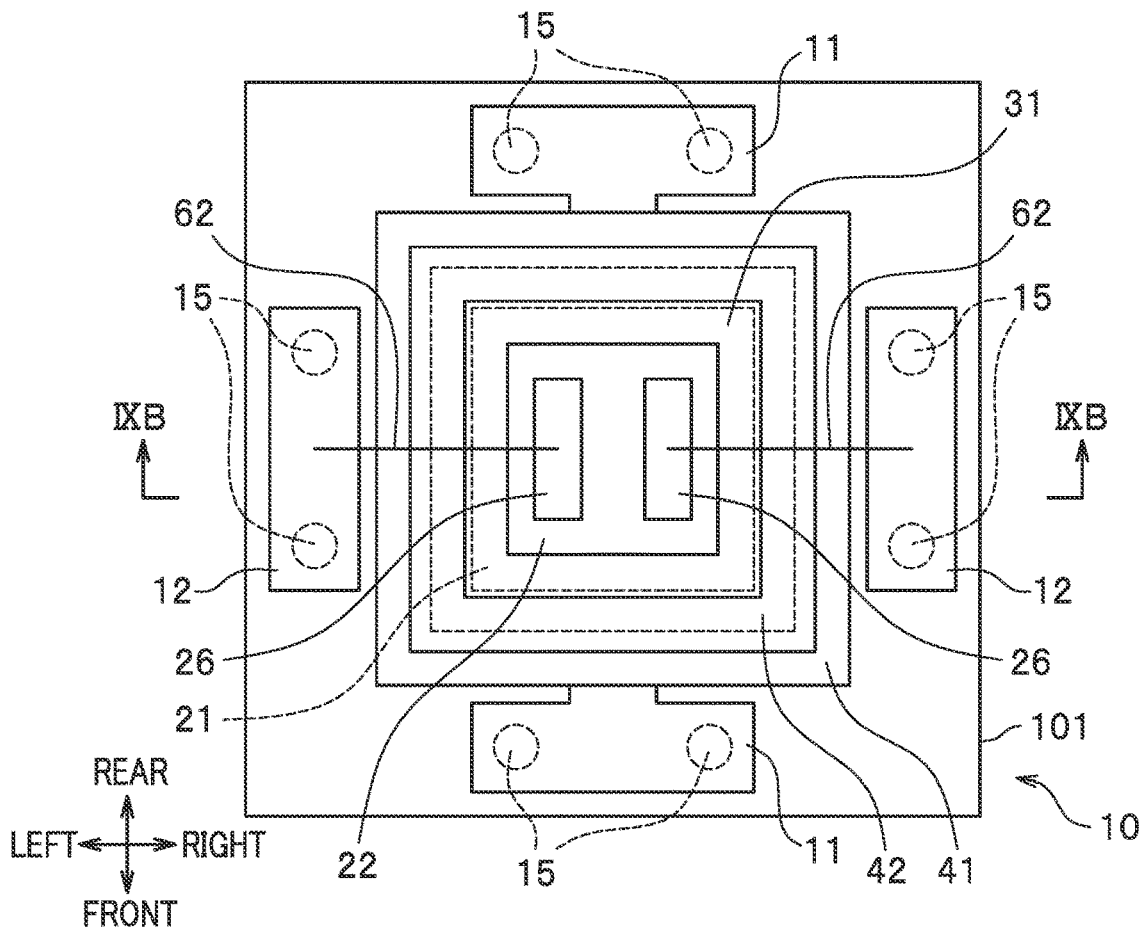
FIG. 9A is a schematic plan view illustrating a state where the second light-emitting element is connected to second wirings using bonding wires in the method of manufacturing the light-emitting device according to the first embodiment.
Figure 9B:
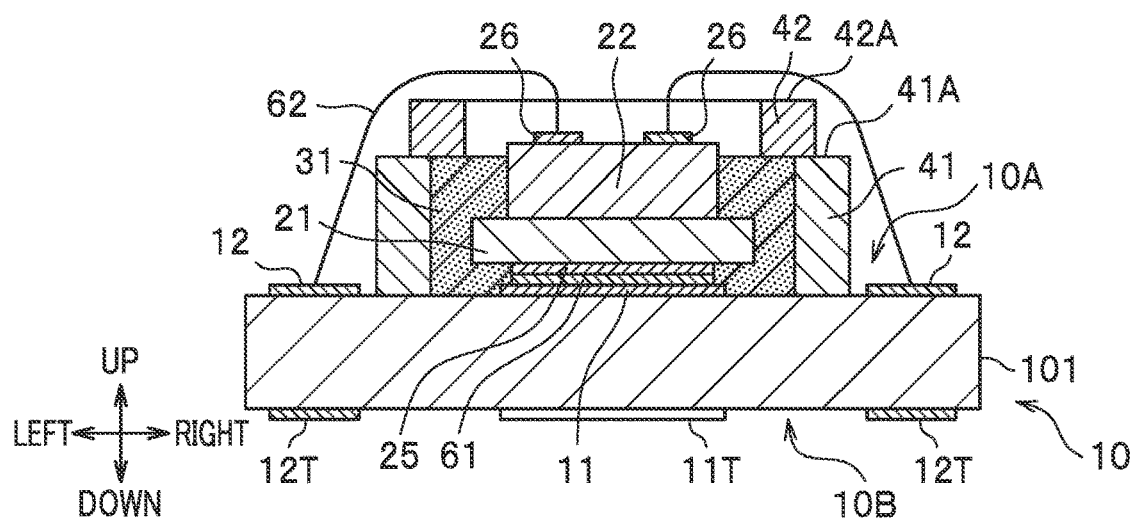
FIG. 9B is a schematic cross-sectional view taken along line IXB-IXB of FIG. 9A.
Figure 10A:
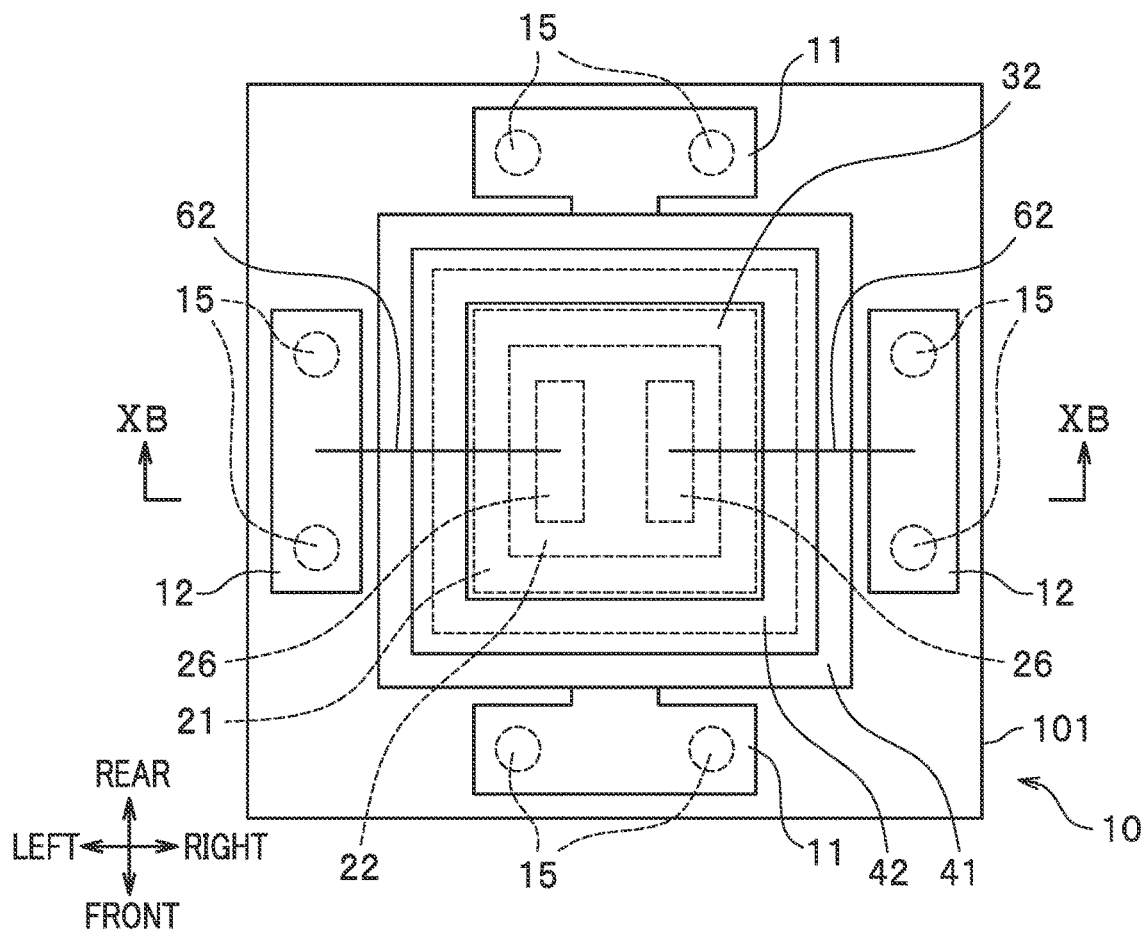
FIG. 10A is a schematic plan view illustrating a state where a second wavelength conversion member is disposed in the method of manufacturing the light-emitting device according to the first embodiment.
Figure 10B:
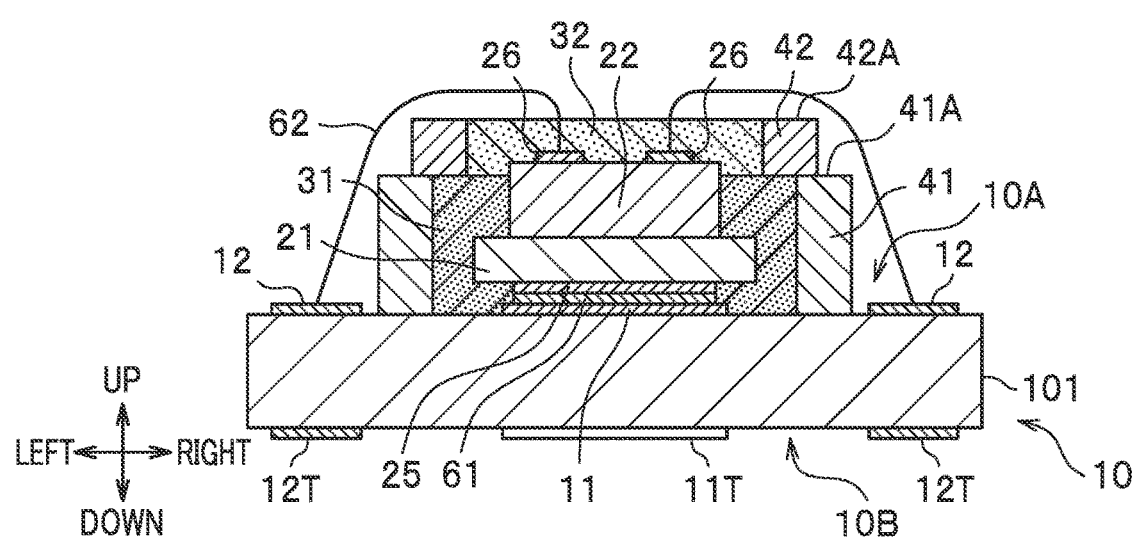
FIG. 10B is a schematic cross-sectional view taken along line XB-XB of FIG. 10A.

In the second frame forming step S42, the second frame 42 is formed on the upper surface of the first wavelength conversion member 31 to surround the second light-emitting element 22. In the example herein, the second frame 42 is formed to surround the second light-emitting element 22 at a certain distance away in a top view in this case as shown in FIGS. 8A and 8B. The second frame 42 is formed in contact with the upper surface of the first wavelength conversion member 31 and the upper surface of the first frame 41. The second frame 42 can be formed in a similar method as for the first frame 41. The upper surface 42A of the second frame 42 is located above the light extraction surface of the second light-emitting element 22.

Second Connecting Step

In the second connecting step S32, the second light-emitting element 22 is electrically connected to the second wirings 12 via the second connecting members 62. In the example herein, the second connecting step S32 is performed after the first disposing step S51 and after the second frame forming step S42, and bonding wires are employed as the second connecting members 62.

The bonding wires are disposed between the exposed element electrodes 26 of the second light-emitting element 22 and the second wiring 12 astride the first frame 41 and the second frame 42.

Second Disposing Step

In the second disposing step S52, the second wavelength conversion member 32 is disposed in the region surrounded by the first frame 41 to be in contact with the surface of the first wavelength conversion member 31 at a side opposite to a side having the substrate 10. In the example herein, in the second disposing step S52, the second wavelength conversion member 32 is disposed in the region surrounded by the second frame 42. The region surrounded by the second frame 42 is located inward of the region surrounded by the first frame 41 in a plan view.

The second disposing step S52 is preferably performed after the second connecting step S32 when bonding wires are employed as the second connecting members 62.

The second wavelength conversion member 32 is disposed to cover the light extraction surface of the second light-emitting element 22 such that the upper surface of the second wavelength conversion member 32 is located above the light extraction surface of the second light-emitting element 22.

The second wavelength conversion member 32 can be formed by, for example, as in the forming of the first wavelength conversion member 31, injecting an uncured resin material mixed with a phosphor with the use of a potting technique and then curing the resin material. Injection of the resin material with the use of a potting technique is preferably performed at a position where the bonding wires is not disposed in a top view so that the bonding wires do not experience loads in a specific direction. Also, in the example herein, the uncured resin material is injected and cured such that the position of the upper surface of the second wavelength conversion member 32 coincides with the position of the upper surface 42A of the second frame 42.

Sealing Step

In the sealing step S60, the sealing member 50 is formed. The sealing member 50 covers the first light-emitting element 21, the second light-emitting element 22, the first frame 41, the second frame 42, the first wavelength conversion member 31, the second wavelength conversion member 32, the first connecting members 61, and the second connecting members 62.

Figure 11A:
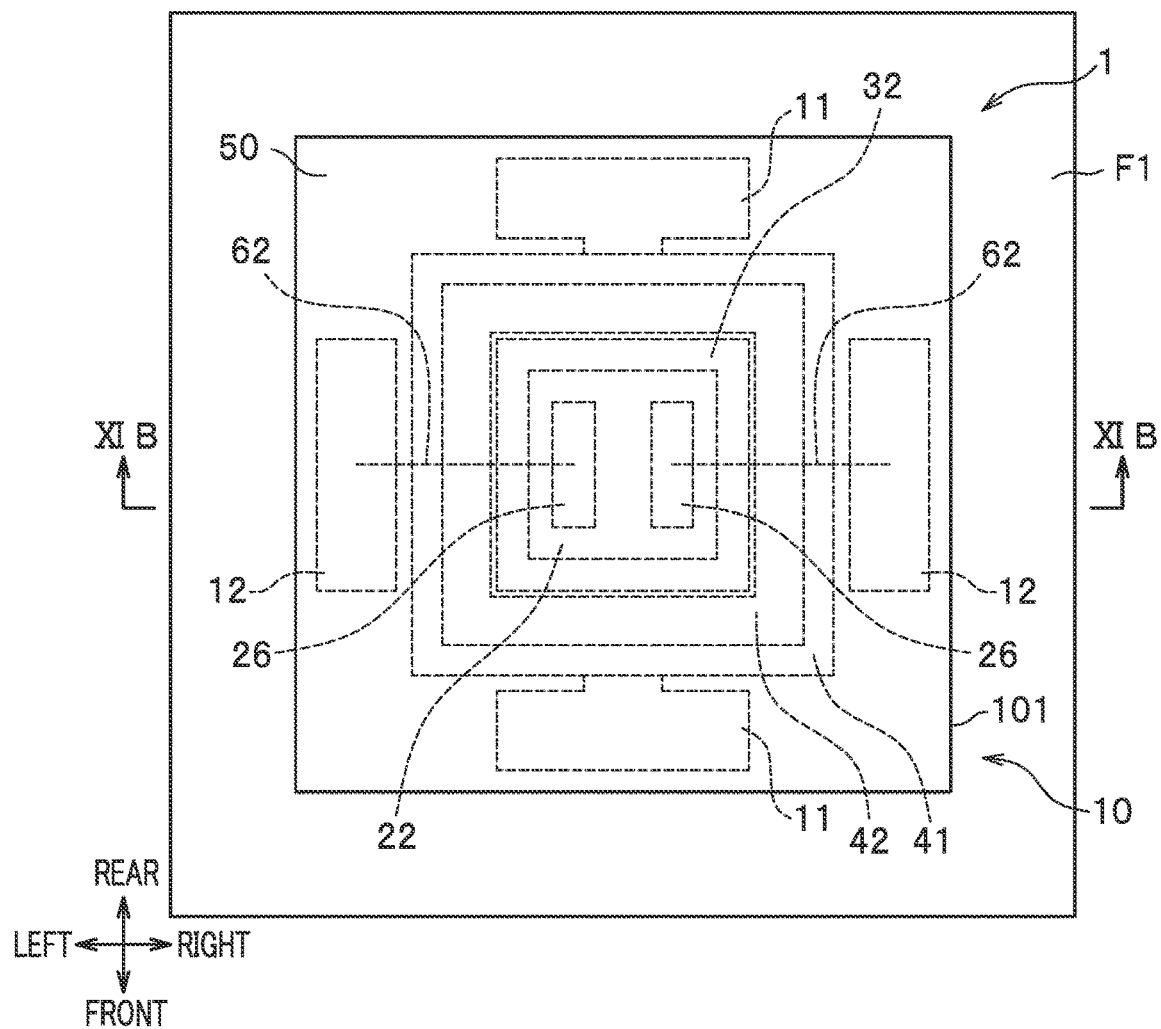
FIG. 11A is a schematic plan view illustrating a state where a sealing member is formed in the method of manufacturing the light-emitting device according to the first embodiment.
Figure 11B:
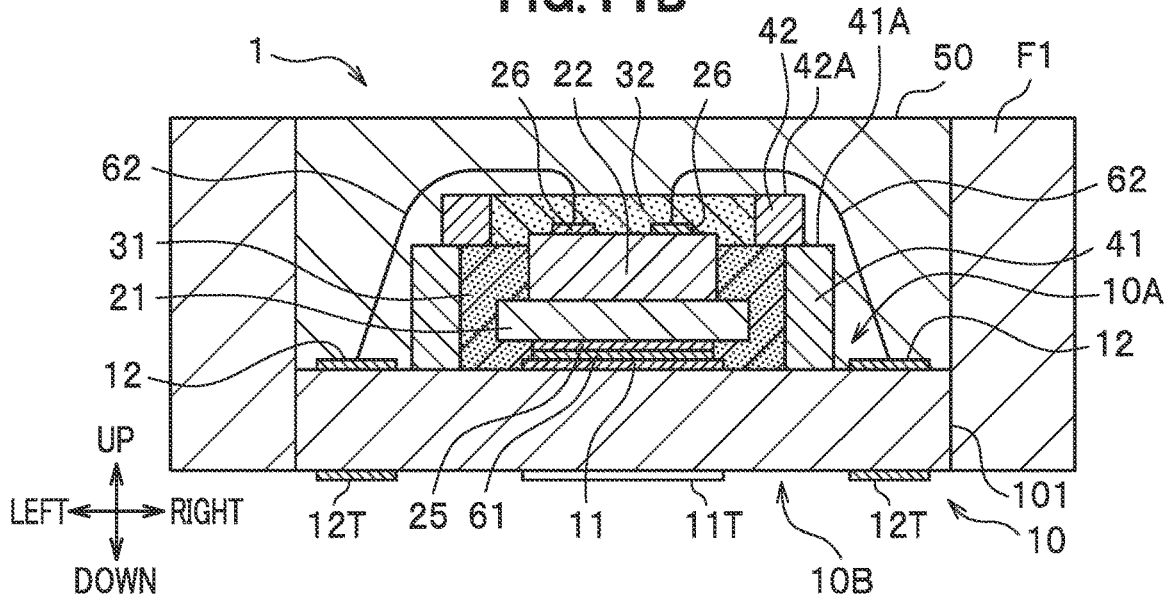
FIG. 11B is a schematic cross-sectional view taken along line XIB-XIB of FIG. 11A.

As shown in FIGS. 11A and 11B, for example, the sealing step S60 can be performed by setting a mold F1 with respect to the light-emitting device 1 before the sealing member 50 is formed, supplying an uncured resin material inside the mold F1, and curing the resin material. The uncured resin material can be injected using a dispensing nozzle or applied by screen printing or spraying, or using combination of these techniques. The inner walls of the mold F1 shown in FIGS. 11A and 11B face the four lateral surfaces of the light-emitting device 1, but a mold further having an inner wall on the upper surface side of the light-emitting device 1 may be used. The outer shape of the sealing member 50 can be adjusted by adjusting the shape of the inner wall of the mold F1. For example, the upper surface of the sealing member 50 may have a spherical shape.

In the method of manufacturing according to the first embodiment, the first wavelength conversion member 31 and the second wavelength conversion member 32 are respectively formed in the regions surrounded by the first frame 41 and the second frame 42 after each of the first frame 41 and the second frame 42 is formed. This allows for determining the regions in which the first wavelength conversion member 31 and the second wavelength conversion member 32 are to be disposed in a top view. The first wavelength conversion member 31 and the second wavelength conversion member 32 can be formed as two layers in the direction from the substrate 10 toward the first light-emitting element 21.

In the second frame forming step S42 of the light-emitting device 1, the second frame 42 may be formed inside the region surrounded by the first frame 41 in a top view. In this case, in the first frame forming step S41, the position of the upper surface 41A of the first frame 41 may coincide with or be located above the position of the light extraction surface of the second light-emitting element 22. Then, in the first disposing step S51, the first wavelength conversion member 31 can be disposed such that the upper surface of the first wavelength conversion member 31 can be located between the light extraction surface of the first light-emitting element 21 and the light extraction surface of the second light-emitting element 22. The inner wall of the first frame 41 may be or may not be in contact with the outer wall of the second frame 42.

Second Embodiment

Figure 12A:
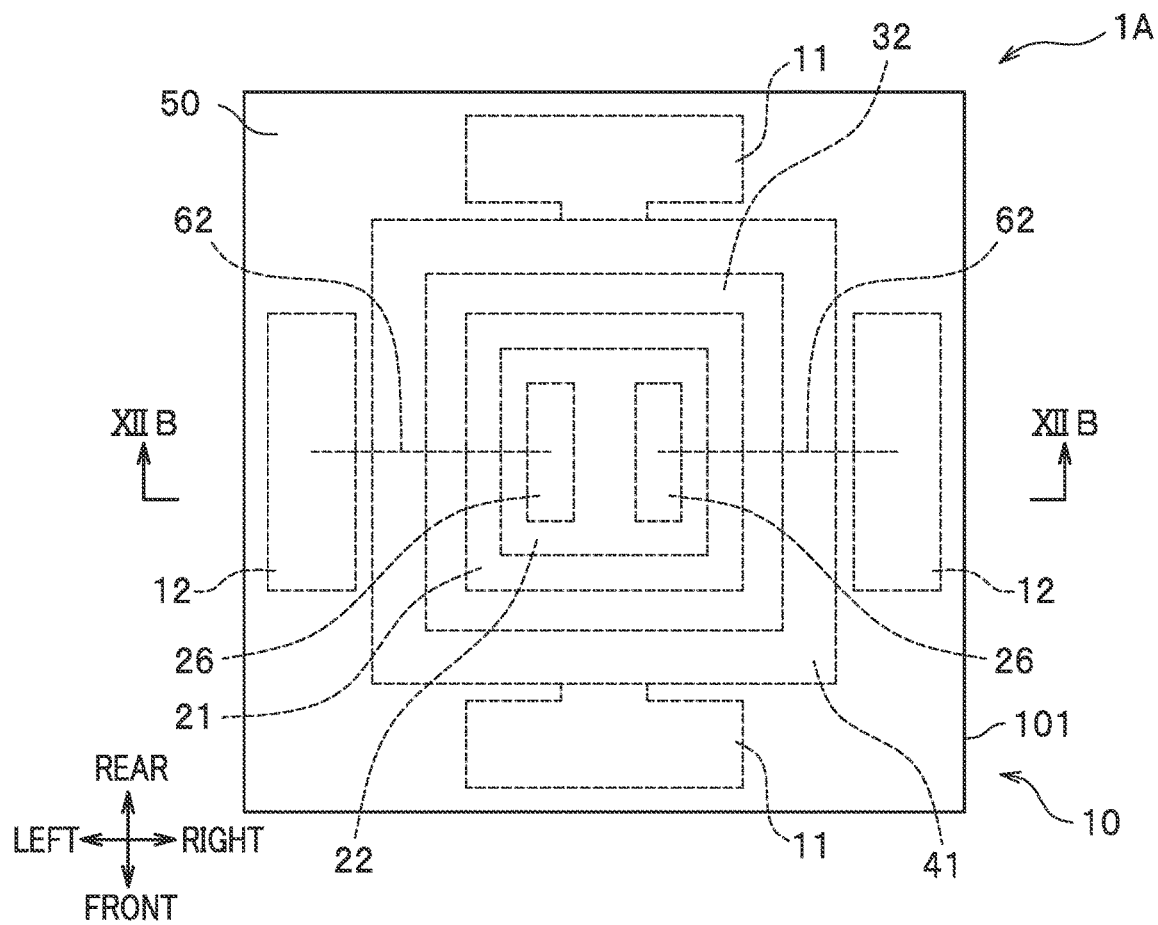
FIG. 12A is a schematic top view of a light-emitting device according to a second embodiment.
Figure 12B:
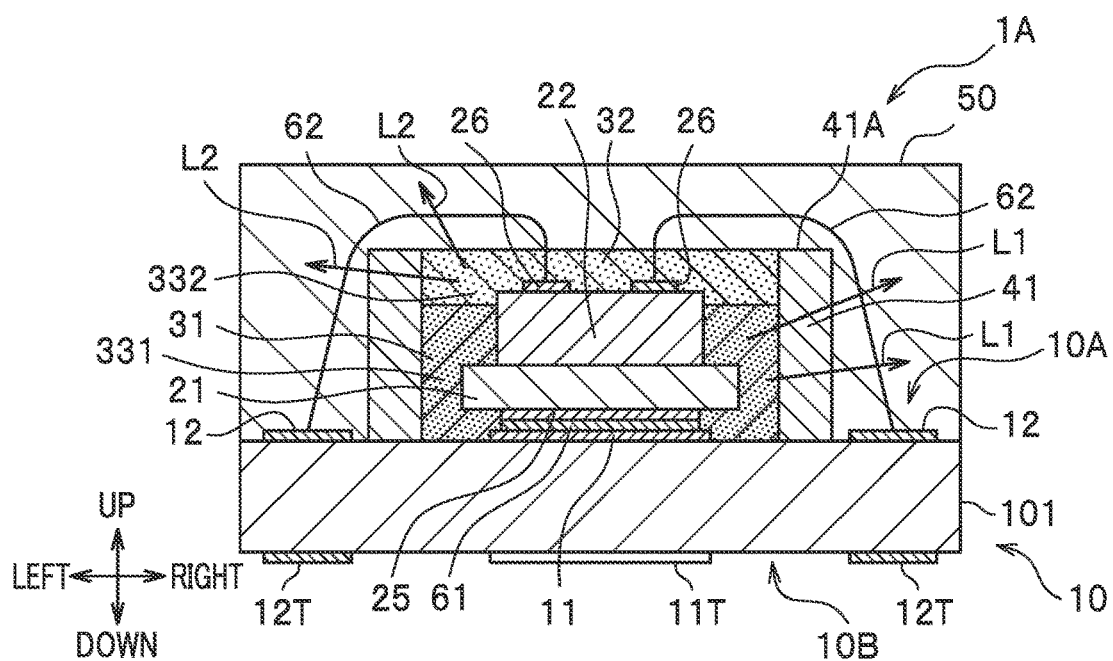
FIG. 12B is a schematic cross-sectional view taken along line XIIB-XIIB of FIG. 12A.

A light-emitting device 1A according to a second embodiment will be described referring to FIGS. 12A and 12B.

The light-emitting device 1A does not include the second frame 42, and the upper surface 41A of the first frame 41 is located above the light extraction surface of the second light-emitting element 22. The first wavelength conversion member 31 and the second wavelength conversion member 32 have the same shape in a top view. The outermost perimeter of the first wavelength conversion member 31 and the outermost perimeter of the second wavelength conversion member 32 are the same in length in a top view. The other structures are the same as those in the light-emitting device 1 according to the first embodiment.

The sealing member 50 of the light-emitting device 1A covers the first light-emitting element 21, the second light-emitting element 22, the first frame 41, the first wavelength conversion member 31, the second wavelength conversion member 32, the first connecting members 61, and the second connecting members 62.

As in the light-emitting device 1, in the light-emitting device 1A, the second light-emitting element 22 is face-up mounted on the face-down (flip-chip) mounted first light-emitting element 21, and the wavelength conversion members with different emission colors are disposed as two layers, so that a small light-emitting device that allows for color adjustment can be obtained. Further, the light-emitting device 1A can be manufactured in a reduced number of steps, compared with the light-emitting device 1.

Manufacturing Method According to Second Embodiment

A method of manufacturing the light-emitting device 1A according to the second embodiment does not include the second frame forming step S42. In the first frame forming step S41, the first frame 41 is formed such that the upper surface 41A of the first frame 41 is located above the light extraction surface of the second light-emitting element 22. The other steps are the same as those in the manufacturing method of the first embodiment.

In the sealing step S60 in the manufacturing method according to the second embodiment, the sealing member 50 is formed. The sealing member 50 covers the first light-emitting element 21, the second light-emitting element 22, the first frame 41, the first wavelength conversion member 31, the second wavelength conversion member 32, the first connecting members 61, and the second connecting members 62.

The chromaticities of the first light L1 and the second light L2 differ from each other in the light-emitting device 1 and the light-emitting, device 1A, but the chromaticities of the first light L1 and the second light L2 can be the same. In the case in which the chromaticities of the first light L1 and the second light L2 are the same, the brightness and the light distribution of the light-emitting device can be adjusted with combination of the first light L1 and the second light L2.

What is claimed is:

1. A light-emitting device comprising:
   a substrate having a first surface and a second surface on an opposite side to the first surface, and including first wirings and second wirings on the first surface;
   a first light-emitting element disposed on the first surface or the first wirings of the substrate and electrically connected to the first wirings via first connecting members, the first light-emitting element having a first surface and a second surface on an opposite side to the first surface, the second surface of the first light-emitting element facing the first surface of the substrate;
   a second light-emitting element disposed on the first surface of the first light-emitting element, and electrically connected to the second wirings via second connecting members;
   a first frame disposed on the first surface of the substrate to surround the first light-emitting element and the second light-emitting element in a top view;
   a first wavelength conversion member disposed in a region surrounded by the first frame in the top view, a lower surface of the first wavelength conversion member being in contact with the first surface of the substrate; and
   a second wavelength conversion member disposed in at least a part of the region surrounded by the first frame in the top view, the second wavelength conversion member being in contact with an upper surface of the first wavelength conversion member,
   wherein a chromaticity of light converted by the first wavelength conversion member differs from a chromaticity of light converted by the second wavelength conversion member.

2. The light-emitting device according to claim 1, wherein the first light-emitting element is face-down mounted on the first surface of the substrate.

3. The light-emitting device according to claim 1, wherein the second light-emitting element is face-up mounted on the first surface of the first light-emitting element.

4. The light-emitting device according to claim 1, wherein an area of a light extraction surface of the first light-emitting element is greater than an area of a light extraction surface of the second light-emitting element.

5. The light-emitting device according to claim 1, wherein in a direction from the substrate toward the first light-emitting element, the upper surface of the first wavelength conversion member is located between a light extraction surface of the first light-emitting element and a light extraction surface of the second light-emitting element, and an upper surface of the second wavelength conversion member is located above the light extraction surface of the second light-emitting element.

6. The light-emitting device according to claim 1, further comprising
   a second frame surrounding the second light-emitting element in the top view, the second frame being in contact with the upper surface of the first wavelength conversion member, wherein
   the second wavelength conversion member is disposed in a region surrounded by the second frame in the top view, and
   in a direction from the substrate toward the first light-emitting element, an upper surface of the first frame is located between a light extraction surface of the first light-emitting element and a light extraction surface of the second light-emitting element, and an upper surface of the second frame is located above the light extraction surface of the second light-emitting element.

7. The light-emitting device according to claim 1, wherein
   in a direction from the substrate toward the first light-emitting element, an upper surface of the first frame is located above the light extraction surface of the second light-emitting element.

8. The light-emitting device according to claim 1, further comprising
   a sealing member covering the first light-emitting element, the second light-emitting element, the first frame, the first wavelength conversion member, the second wavelength conversion member, the first connecting member, and the second connecting member.

9. The light-emitting device according to claim 6, further comprising
   a sealing member covering the first light-emitting element, the second light-emitting element, the first frame, the second frame, the first wavelength conversion member, the second wavelength conversion member, the first connecting member, and the second connecting member.

10. The light-emitting, device according to claim 1, wherein
    an outermost perimeter of the first wavelength conversion member is longer than an outermost perimeter of the second wavelength conversion member in the top view.

11. The light-emitting device according to claim 1, wherein
    the first wavelength conversion member has a thickness greater than a thickness of the second wavelength conversion member as measured along a direction from the substrate toward the first light-emitting element.

12. The light-emitting device according to claim 1, wherein
    the chromaticity of the light converted by the first wavelength conversion member is on a longer wavelength side than the chromaticity of the light converted by the second wavelength conversion member.

13. The light-emitting device according to claim 1, wherein
    the first wavelength conversion member includes at least one of a YAG phosphor, a LAG phosphor, a SCASN phosphor, a CASH phosphor, and a KSF phosphor as a wavelength conversion substance, and the second wavelength conversion member includes at least one of a YAG phosphor, a LAG phosphor, a SCASN phosphor, or a KSF phosphor as a wavelength conversion substance.

14. A method of manufacturing a light-emitting device, the method comprising:
    providing a substrate having a first surface and a second surface on an opposite side to the first surface, the substrate including first wiring and second wiring on the first surface;
    disposing a first light-emitting element on the first surface or the first wiring of the substrate, the first light-emitting element having a first surface and a second surface on an opposite side to the first surface, the second surface of the first light-emitting element facing the first surface of the substrate;
    electrically connecting the first light-emitting element to the first wiring via a first connecting member;
    disposing a second light-emitting element on the first surface of the first light-emitting element;
    forming a first frame on the first surface of the substrate to surround the first light-emitting element and the second light-emitting element in a top view;
    disposing a first wavelength conversion member in a region surrounded by the first frame in the top view so that a lower surface of the first wavelength conversion member is in contact with the first surface of the substrate;
    electrically connecting the second light-emitting element to the second wiring via a second connecting member, and
    disposing a second wavelength conversion member in at least a part of the region surrounded by the first frame in the top view so that the second wavelength conversion member is in contact with an upper surface of the first wavelength conversion member.

15. The method of manufacturing a light-emitting device according to claim 14, wherein
    the disposing of the first wavelength conversion member includes disposing the first wavelength conversion member such that a light extraction surface of the second light-emitting element is exposed from the first wavelength conversion member,
    the electrically connecting of the second light-emitting element includes the electrically connecting of the second light-emitting element to the second wiring via a bonding wire as the second connecting member after the disposing of the first wavelength conversion member, and
    the disposing of the second wavelength conversion member is performed after the electrically connecting of the second light-emitting element to the second wiring.

16. The method of manufacturing a light-emitting device according to claim 14, further comprising
    forming a second frame on an upper surface of the first wavelength conversion member to surround the second light-emitting element in the top view, wherein
    the disposing of the second wavelength conversion member includes disposing the second wavelength conversion member in a region surrounded by the second frame in the top view.

17. The method of manufacturing a light-emitting device according to claim 14, further comprising
    forming a sealing member to cover the first light-emitting element, the second light-emitting element, the first frame, the first wavelength conversion member, the second wavelength conversion member, the first connecting member, and the second connecting member.

18. The method of manufacturing a light-emitting device according to claim 16, further comprising
    forming a sealing member to cover the first light-emitting element, the second light-emitting element, the first frame, the second frame, the first wavelength conversion member, the second wavelength conversion member, the first connecting member, and the second connecting member.

* * * * *